(12) United States Patent
Tokunaga et al.

(10) Patent No.: US 7,114,144 B2
(45) Date of Patent: Sep. 26, 2006

(54) MASK PATTERN INSPECTING METHOD, INSPECTION APPARATUS, INSPECTING DATA USED THEREIN AND INSPECTING DATA GENERATING METHOD

(75) Inventors: Shinya Tokunaga, Kyoto (JP); Hiroyuki Tsujikawa, Shiga (JP); Tadashi Tanimoto, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 200 days.

(21) Appl. No.: 10/722,346

(22) Filed: Nov. 26, 2003

(65) Prior Publication Data

US 2004/0148584 A1    Jul. 29, 2004

(30) Foreign Application Priority Data

Nov. 26, 2002   (JP) .......................... P. 2002-342304

(51) Int. Cl.
   *G06F 17/50*   (2006.01)
(52) U.S. Cl. ............................. 716/21; 716/19; 716/20
(58) Field of Classification Search ............ 716/19–21; 430/5; 382/144, 224
   See application file for complete search history.

(56) References Cited

U.S. PATENT DOCUMENTS

| 6,137,901 A | 10/2000 | Harazaki |
| 6,801,824 B1 * | 10/2004 | Ishida et al. ................. 700/121 |
| 2004/0133369 A1 * | 7/2004 | Pack et al. .................... 702/59 |

FOREIGN PATENT DOCUMENTS

| JP | 2000-113189 | 4/2000 |
| JP | 2002-196483 | 7/2002 |
| JP | 2002-258463 | 9/2002 |
| JP | 2003-121983 | 4/2003 |

* cited by examiner

*Primary Examiner*—Vuthe Siek
(74) *Attorney, Agent, or Firm*—McDermott Will & Emery LLP

(57) ABSTRACT

A method of inspecting a photomask for a semiconductor integrated circuit formed based on drawing pattern data, includes the steps of classifying a drawing pattern of the semiconductor integrated circuit into a plurality of ranks in accordance with a predetermined reference and extracting the same, determining inspecting accuracy for each of the ranks, and deciding quality of the photomask depending on whether the determined inspecting accuracy is satisfied.

19 Claims, 22 Drawing Sheets

○ IN THE CASE IN WHICH SPECIFICATION IS CARRIED OUT BY REGION

FIG. 6   ○ IN THE CASE IN WHICH SPECIFICATION IS CARRIED OUT BY PATTERN
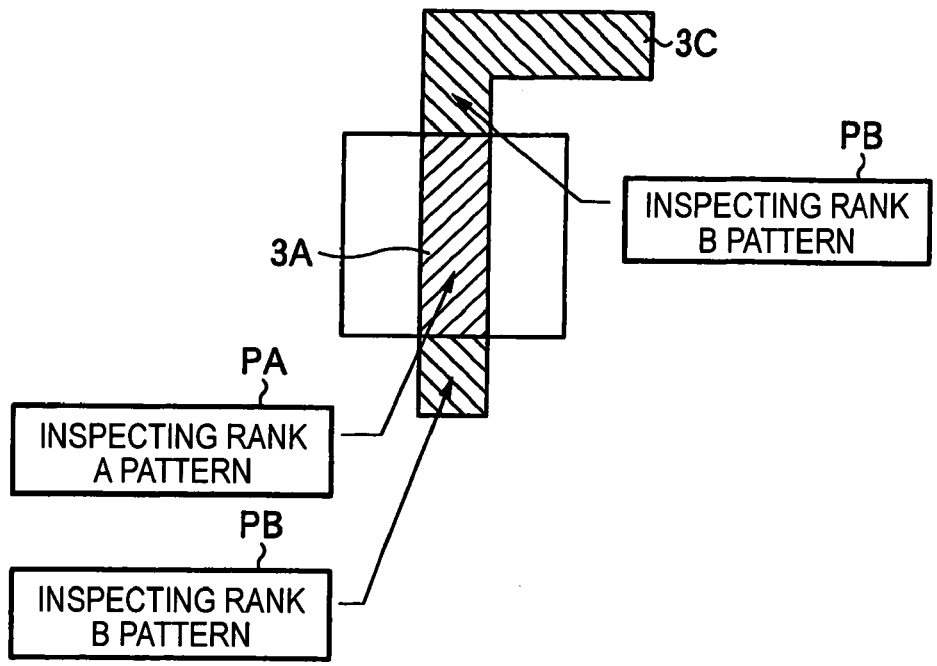
FIG. 7   ○ IN THE CASE IN WHICH SPECIFICATION IS CARRIED OUT BY EDGE
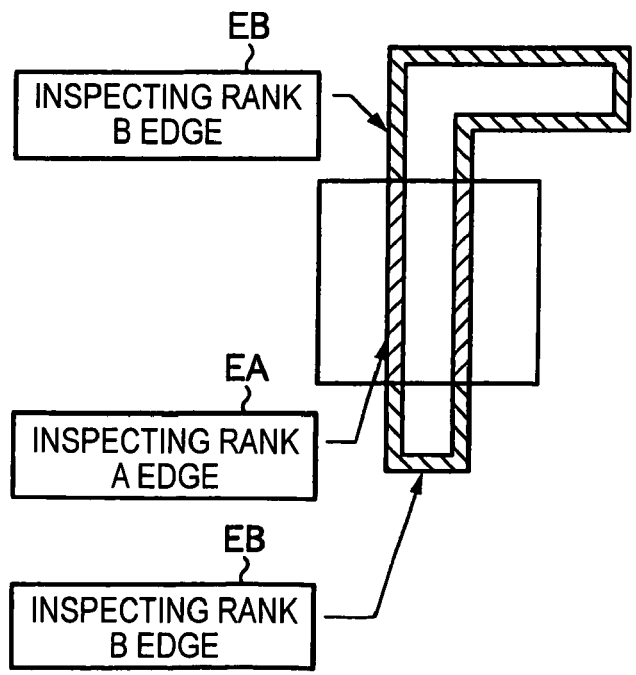

○ IN THE CASE IN WHICH SPECIFICATION IS CARRIED OUT BY PATTERN

○ IN THE CASE IN WHICH SPECIFICATION IS CARRIED OUT BY REGION

○ IN THE CASE IN WHICH SPECIFICATION IS CARRIED OUT BY EDGE

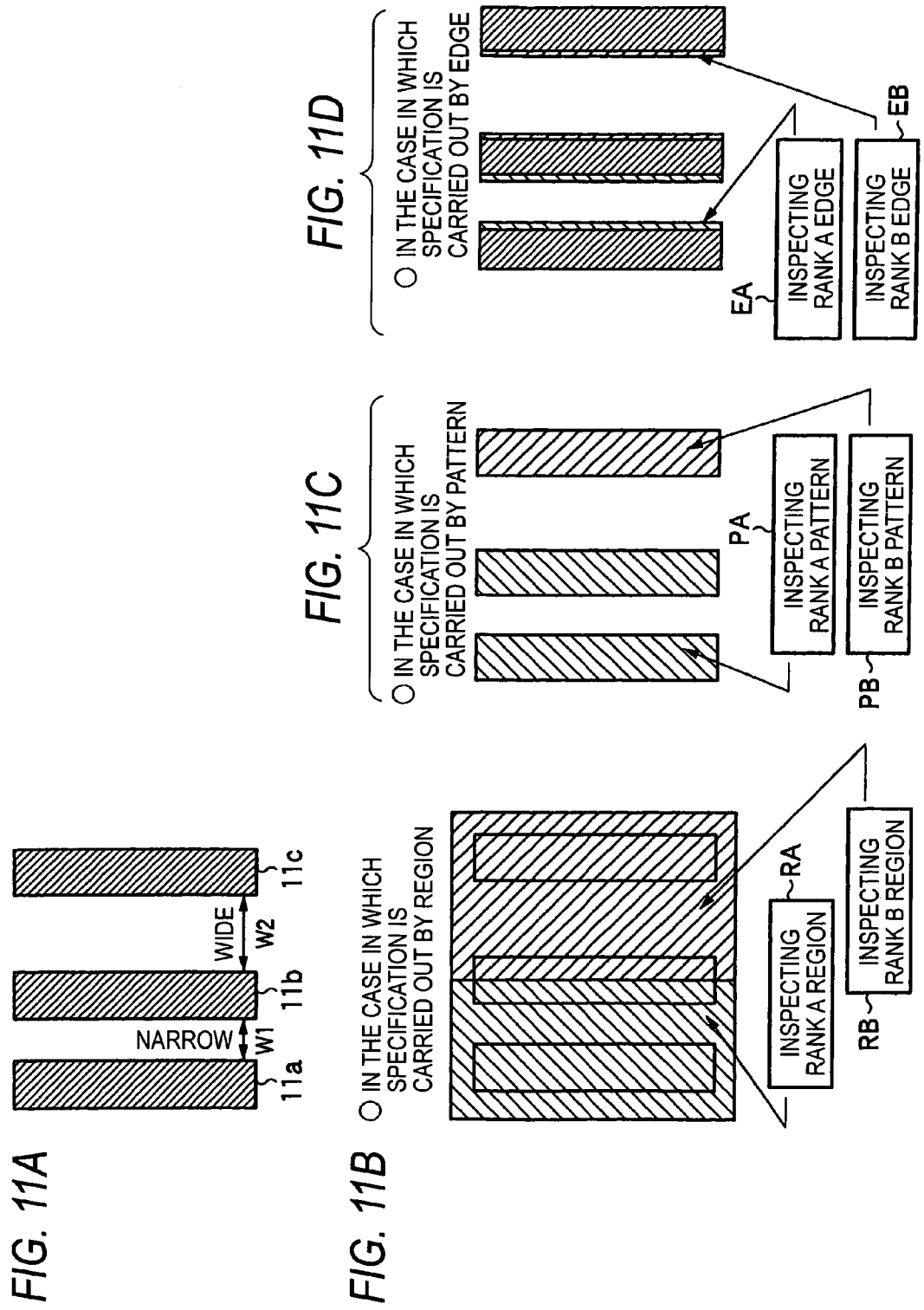

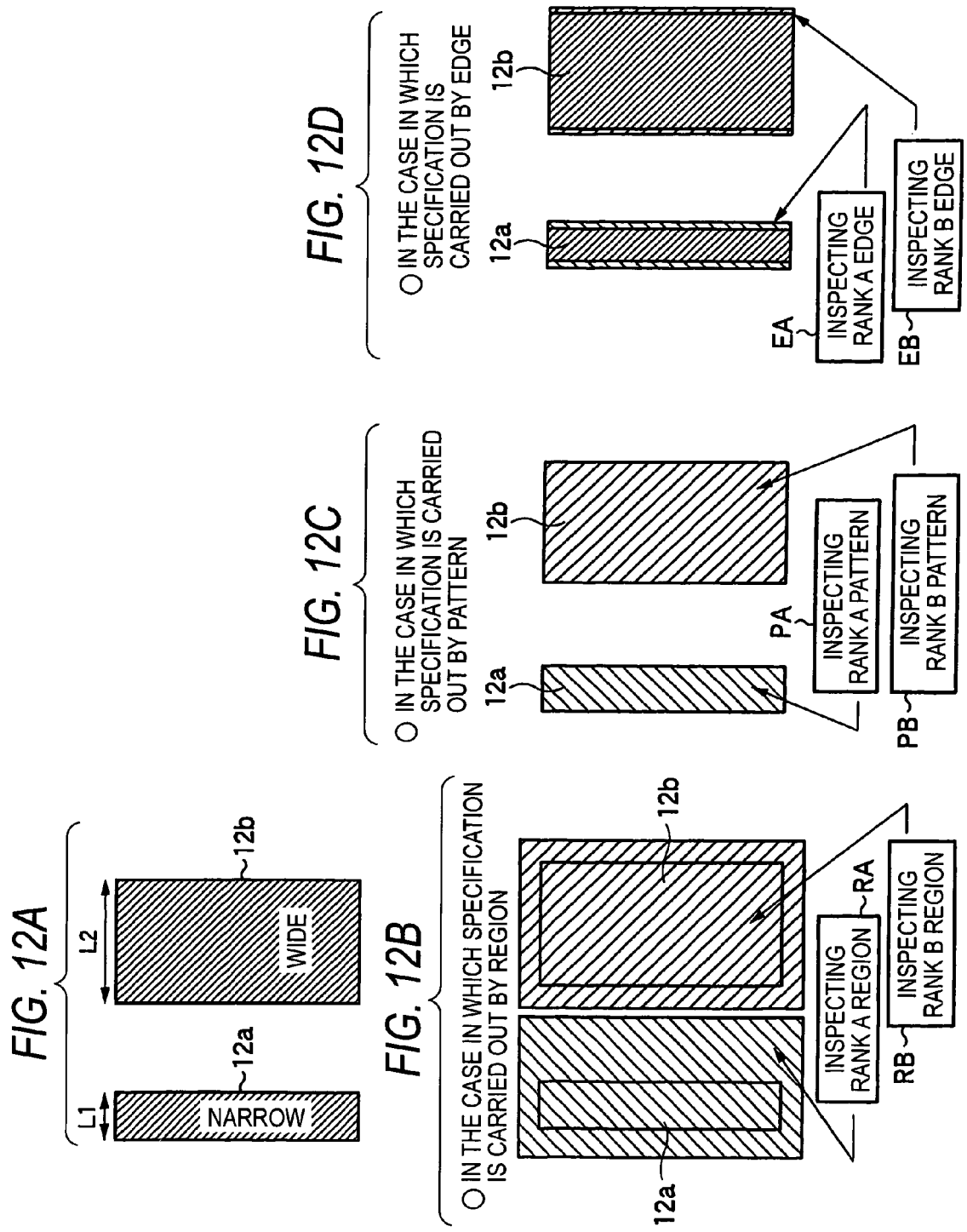

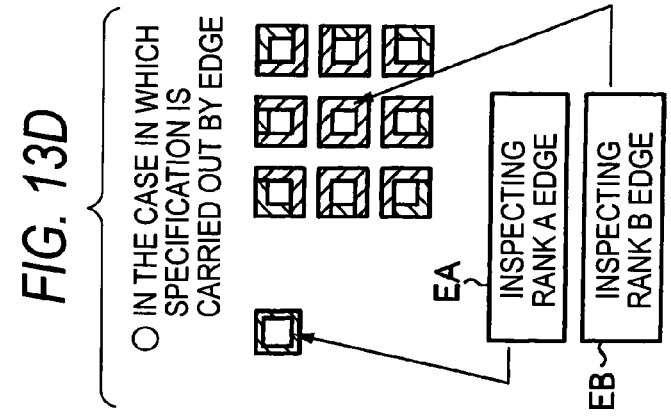
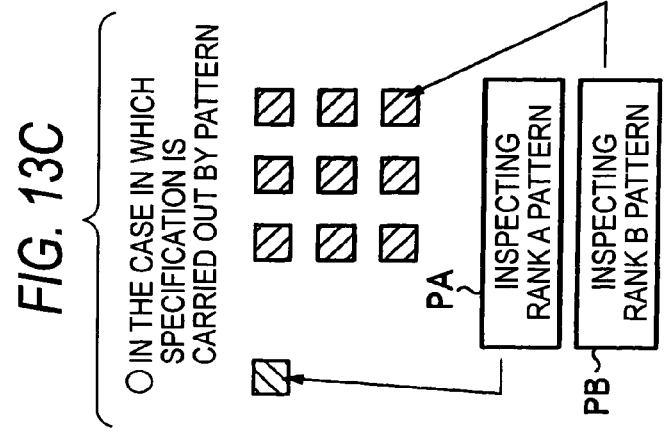
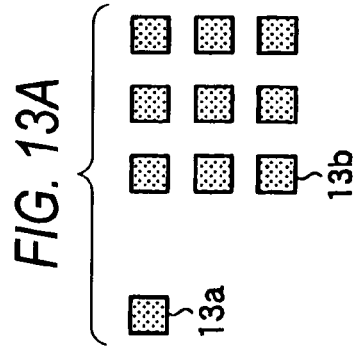
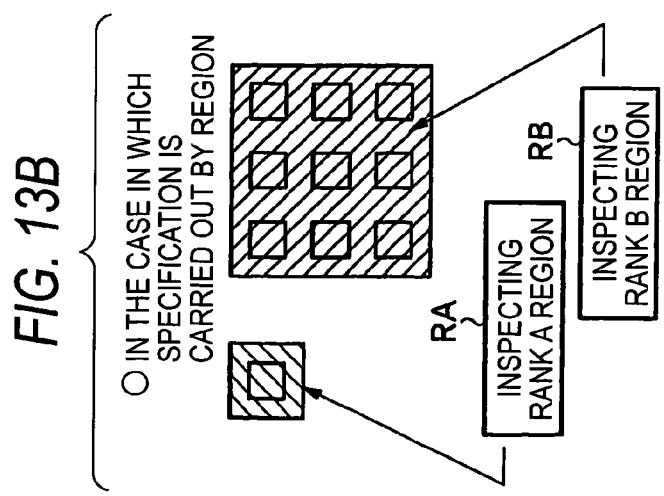

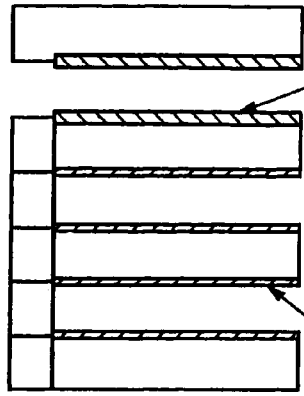
FIG. 14D ○ IN THE CASE IN WHICH SPECIFICATION IS CARRIED OUT BY EDGE
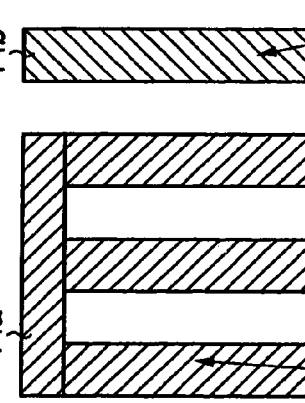
FIG. 14C ○ IN THE CASE IN WHICH SPECIFICATION IS CARRIED OUT BY PATTERN
FIG. 14A
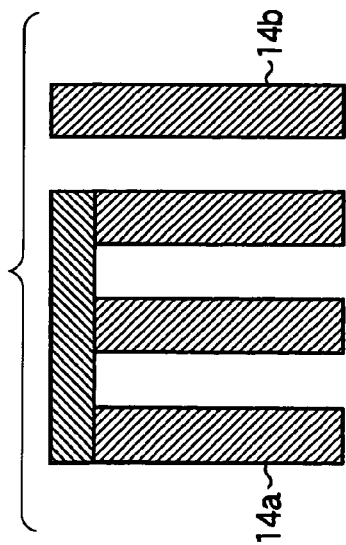
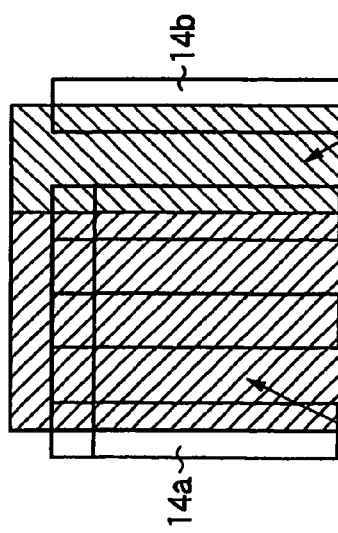
FIG. 14B ○ IN THE CASE IN WHICH SPECIFICATION IS CARRIED OUT BY REGION SHORT DEFECT AREA = Ln (I+S)

DEFECT SIZE (x) < S
NO SHORT DEFECT
Ca (x) = 0

S < DEFECT SIZE (x) < 2I+S
SHORT DEFECT IN SOME PLACES
Ca (x) = Ln (I+S)(X−S)/(I+S)

2I+S < DEFECT SIZE (x)
SHORT DEFECT IN ALL PLACES
Ca (x) = Ln (I+S)

FIG. 18A
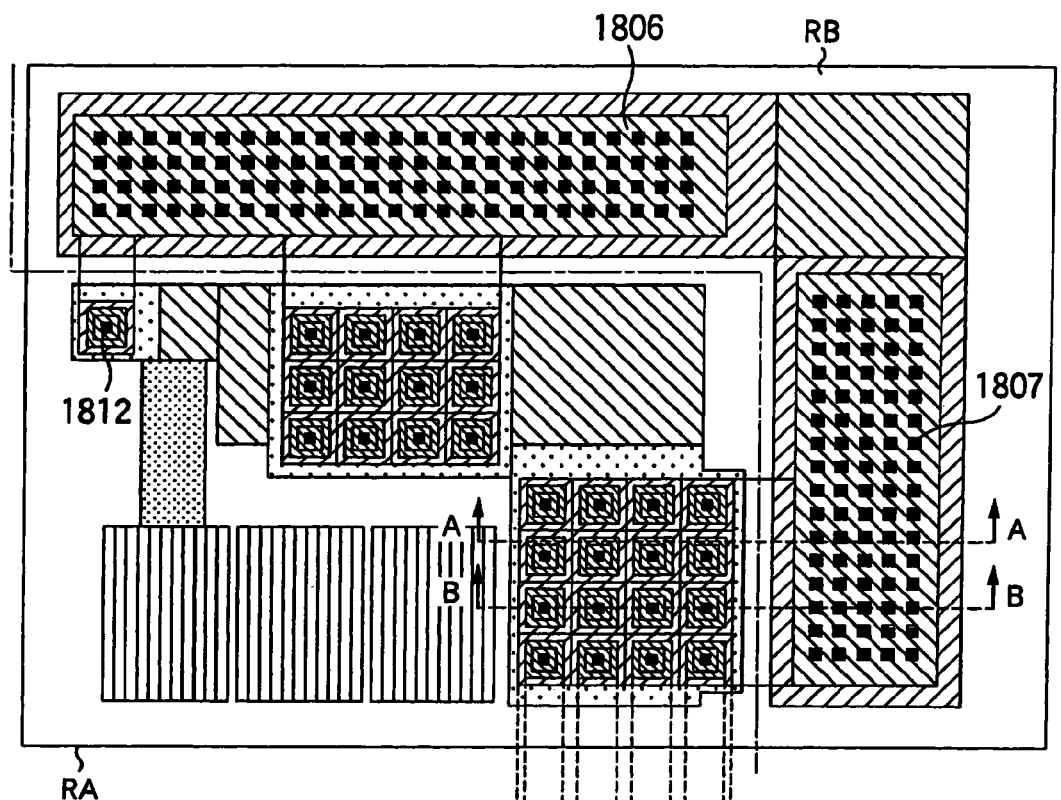
FIG. 18B  A-A
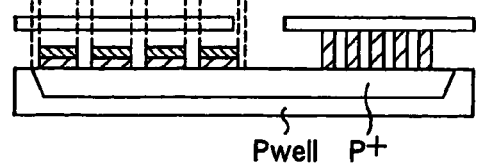
FIG. 18C  B-B
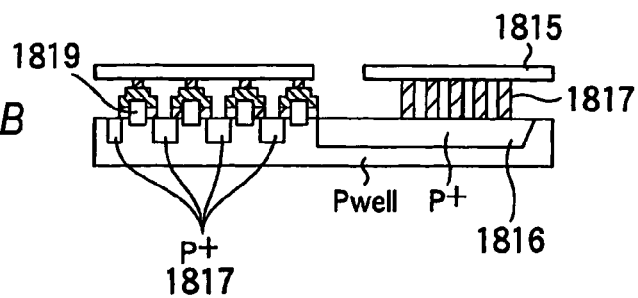

PRIOR ART

MASK PATTERN INSPECTING METHOD, INSPECTION APPARATUS, INSPECTING DATA USED THEREIN AND INSPECTING DATA GENERATING METHOD

The present application is based on Japanese Patent Application No. 2002-342304, which is incorporated herein by reference.

BACKGROUND OF THE INVENTION

1. Field of the Invention

The present invention relates to a method of inspecting a mask pattern, an inspection apparatus, inspecting data used therein and a method of generating the inspecting data, and more particularly to the extraction and inspection of inspecting accuracy data in a process for inspecting a photomask.

2. Description of the Related Art

In recent years, a semiconductor integrated circuit device (hereinafter referred to as an LSI) in each product is evaluated as a key device, and an increase in the scale and speed of the LSI has been required in order to maintain the competitiveness of the product. A fine process is necessary with the microfabrication of an element and an increase in integration.

Under the circumstances, process conditions have been increasingly restricted in order to form a pattern as designed.

In the formation of the semiconductor integrated circuit device, an isolation is carried out over, the surface of a semiconductor substrate and a well having a desirable concentration is formed, and an impurity diffusion region having a desirable conductivity type is formed in the well, and furthermore, an insulating film is formed and a wiring pattern is provided.

For example, in the formation of the wiring pattern, a photolithographic step of forming a conductive film such as a polycrystalline silicon layer, an aluminum layer or a metal silicide layer and then carrying out exposure through a photomask to form a desirable mask pattern is carried out, and etching is performed by using the mask pattern as a mask, thereby forming the wiring pattern.

At the etching step, the conductive film exposed from the mask pattern is selectively removed. Even if various conditions such as the concentration and temperature of an etchant are optimized, an etching speed is varied depending on the density (area ratio) of the mask pattern, and furthermore, the peripheral length of the mask pattern. For this reason, accuracy in etching is varied depending on the density of the mask pattern or a pattern pitch. Even if a mask pattern region is excessively large or small, the accuracy in the etching is reduced.

Moreover, the formation of a diffusion layer also has the same problems. If an ion implantation region for forming the diffusion layer is too small, the concentration of the ion is generated so that a desirable diffusion profile cannot be obtained. Accordingly, the accuracy in the photomask for forming the mask pattern for diffusion is also very important.

In each process, a pattern is formed by using the photomask. The pattern accuracy of the mask pattern on the photomask greatly depends on the accuracy in the pattern formation in the process. Therefore, a demand for an enhancement in the accuracy has been increased.

Under the circumstances, at a defect inspecting step, necessary accuracy for a region which is to have the highest accuracy in a photomask to be inspected is acquired from a photomask designer and an inspection is carried out by using a value thereof as a reference value. Thus, an effort to reduce the defect of the photomask has been made.

For this reason, over one photomask, all regions are inspected based on the same inspection reference. Therefore, a defect set within such a range as not to originally influence an actual circuit operation is treated to be present, and correction or manufacture is carried out again. Consequently, there is a problem in that a time (TAT) required from an order to a completion is increased.

Moreover, the photomask is expensive. Therefore, a sudden rise in a cost caused by the necessity of a large number of photomask blanks for carrying out the manufacture again is also a serious problem.

In a recent process for manufacturing a semiconductor integrated circuit, moreover, there has been proposed a method of CMP (Chemical Mechanical Etching) for flattening the surface of a substrate. For example, this method serves to form an insulating film on a surface by a coating method of a CVD method and to then carry out chemical etching while performing mechanical polishing, thereby flattening the surface. In the case in which the pattern density of a wiring layer to be a lower layer is low and there is a region including a pattern having a predetermined area or less, however, the flattening cannot be carried out even if the insulating film is formed thickly. As a result, a region having no wiring pattern after the CMP becomes a concave portion so that a dent state is maintained.

In the case in which the layout pattern has a deviation, thus, sufficient pattern accuracy for the layer cannot be obtained. In addition, there is a problem in that the pattern accuracy of an upper layer is also influenced. Consequently, there is a problem in that the process accuracy cannot be sufficiently obtained.

Therefore, it is conceived to extract the area ratio of the mask pattern from the layout pattern of a semiconductor chip, additionally providing a dummy pattern to the layout pattern to adapt the area ratio of the mask pattern of a layer constituting the layout pattern in consideration of the optimum area ratio of the layout pattern of the layer obtained based on the process conditions of the layer, thereby setting the layer to have the optimum area ratio.

A photomask to be a very important element in such an increase in accuracy in a pattern is used through a defect inspecting step.

Also in the inspection, necessary accuracy in a portion in which the toughest accuracy conditions in the photomask to be inspected is acquired from the designer of the photomask and the inspection is carried out by using the data.

According to this method, it is possible to advance the inspection without specifying a place having the toughest portion in the creation and inspection of the photomask. Thus, a yield can be enhanced.

Description will be given to a conventional photomask inspecting flow with reference to the drawings.

FIG. 25 is a flow chart showing a conventional photomask inspection.

In this method, first of all, the pattern of a photomask is created based on a design rule (step 101). Next, the pattern of the photomask thus obtained is converted into data for photomask drawing and data are transferred to the manufacturing division of the photomask or another manufacturing company thereof so that a photomask is started to be actually manufactured (step 102).

The minimum value of the design rule of a pattern is specified as inspection accuracy data when the data are thus transferred (step 106).

On the other hand, the photomask manufacturing division or another manufacturing company thereof draws a pattern on a photomask blank by using the drawing data of the photomask formed at the step 102, thereby forming the photomask (step 103).

Next, the result of the pattern formation is decided based on the inspecting accuracy data obtained at the step 106 (step 104).

Then, it is decided that only the pattern formation decided to be within the range of the inspecting accuracy data is acceptable (step 105).

With the recent microfabrication of a process, however, a minimum pattern width and a minimum interval tend to be increasingly reduced. For example, consideration will be given to the case in which there is formed a photomask including patterns 210 to 213 having a minimum width which is arranged at a minimum interval 203 as shown in FIG. 26A and patterns 214 to 216 provided at a large interval 204 as shown in FIG. 26B. For example, it is assumed that the tolerance of a defect formed in a pattern having the minimum interval 203 is set to have a size represented by an allowable defect 201. At this time, in the case in which a pattern defect 206 having a smaller size than the size of the defect 201, it is decided that this is the tolerance at the inspecting step.

In the case in which there is a pattern defect 202 having a greater size than the size of the allowable defect 201, moreover, it is decided that the photomask is a defect in the inspection because the defect 202 is larger than the allowable defect 201 at the inspecting step.

However, the allowable defect 201 has one size in the same photomask and the same processing is carried out based on the allowable defect 201 in any region having a great pattern width.

For this reason, in the case in which there is the pattern defect 202 having a greater size than the size of the allowable defect 201, the interval 204 is much greater than the minimum interval 203 as shown in FIG. 26B. Therefore, it is decided that the defect 202 is also a defect at the inspecting step between the patterns 214 and 215. Even if such a defect is thus present in the region having a great interval in an actual design rule, however, there is no problem. In spite of the foregoing, a correcting step is started so that a step of carrying out an inspection again is added.

In the conventional method, thus, a demand for inspecting accuracy corresponding to the minimum interval 203 is given over the whole photomask. Therefore, it is decided that the defect 202 having such a size as not to make troubles is also a defect at the inspecting step.

Also in the case in which the same defect is generated and patterns might be actually short-circuited with each other, there is no problem when an adjacent pattern has the same node or a dummy pattern is formed for the purpose. Accordingly, it is not necessary to carry out the correction. However, the same defect is decided to be a defect in this case, the correcting step is started and the step of carrying out the inspection again is added.

Therefore, the inspection is executed with unnecessary accuracy so that a correction frequency is increased. Consequently, there is an obvious problem in that a reduction in a photomask creating period (TAT) and a decrease in the cost of creation are hindered.

SUMMARY OF THE INVENTION

In consideration of the actual circumstances, the invention has been made and has an object to provide a method of inspecting a photomask which can shorten a TAT and decrease a cost.

It is another object to provide an apparatus for inspecting a photomask which can shorten the TAT and decrease the cost.

It is yet another object to provide inspecting data capable of shortening the TAT and decreasing the cost in order to create the photomask.

It is a further object to provide a method of generating inspecting data which can shorten the TAT and decrease the cost in order to create the photomask.

In order to attain the objects, a method according to the invention is characterized in that accuracy data on each pattern are extracted based on the feature of the pattern and an inspection is carried out based on the accuracy data so that the inspection can be performed with high accuracy.

Hereupon, the pattern constituting a semiconductor integrated circuit indicates a pattern constituting a functional region excluding the scribe line on a wafer.

More specifically, the invention provides a method of inspecting a photomask for a semiconductor integrated circuit formed based on drawing pattern data, comprising the steps of classifying a drawing pattern of the semiconductor integrated circuit into a plurality of ranks in accordance with a reference depending on a feature of the drawing pattern and extracting the same, determining inspecting accuracy for each of the ranks, and deciding quality of the photomask depending on whether the determined inspecting accuracy is satisfied. When a pad region has a large pattern, moreover, it is desirable that the pad region should be set to be a separate accuracy region having a low rank and the region excluding the region should be classified into a plurality of ranks to create inspecting data.

According to this method, accuracy data on each pattern are extracted and are classified into a plurality of ranks to carry out the inspection with high accuracy based on the feature of the pattern. Consequently, it is possible to create a photomask having a high reliability in a short time. Moreover, a sudden rise in a cost can be prevented from being caused by recreation to obtain unnecessary accuracy. Thus, the cost can be reduced.

It is desirable that the inspection can be carried out more properly if the accuracy data are classified into a plurality of ranks and are thus extracted corresponding to the functional feature of the drawing pattern. The functional feature implies that the inspection is carried out in consideration of a feature based on the function of the pattern, that is, a circuit-functional feature of a pattern formed by the drawing pattern. For example, in the case in which the drawing pattern of the photomask includes the pattern of a gate electrode defining the channel length of a transistor or the case in which the drawing pattern of the photomask includes a mask pattern for ion implantation to form a pn junction to be a region defining a sensor area, these patterns are to have higher accuracy. In case of the same node or a dummy pattern, moreover, the accuracy may be lower than that in other regions. Thus, it is possible to classify the accuracy into ranks corresponding to the functional feature of the pattern, thereby carrying out the inspection more properly at a high speed.

It is desirable that the extracting step should serve to classify the drawing pattern of the semiconductor integrated circuit into a plurality of ranks and to extract the same depending on whether the drawing pattern is a dummy pattern.

In case of the dummy pattern, the accuracy may be lower than that in other regions. Accordingly, a higher speed inspection is made possible by inspecting the dummy pattern in accordance with a reference independent of the reference for other patterns. A higher speed inspection is also made possible by inspecting patterns other than the real pattern and not formed directly on the wafer, e.g., assist bar, sub-opening portion in the phase shift mask in accordance with a reference independent of the reference for other patterns.

Further, the extracting step may further include a step of classifying the drawing pattern into a plurality of ranks depending on whether a pattern adjacent to the drawing pattern is a dummy pattern.

When the pattern adjacent to the dummy pattern is not a dummy pattern, the accuracy is required even if the drawing pattern is a dummy pattern. On the other hand, the dumpy patterns are adjacent with each other, the accuracy is not required. A high speed inspection is made possible by classifying these cases.

It is desirable that the extracting step should serve to classify the drawing pattern of the semiconductor integrated circuit into a plurality of ranks and to extract the same depending on whether the drawing pattern has the same node.

It is desirable that the inspection can be carried out more properly if the drawing pattern is classified into a plurality of ranks and is thus extracted corresponding to the feature of the shape of the drawing pattern. For example, the inspection can be carried out more efficiently by a method of classifying the drawing pattern into a plurality of ranks and extracting the same based on a distance from the closest pattern, or classifying the drawing pattern into a plurality of ranks and extracting the same based on a distance from the corner of the drawing pattern.

Moreover, the unit of the classification can easily be sliced by classifying each pattern into a plurality of ranks and extracting the same corresponding to the reference. Thus, the classification can efficiently be carried out.

Referring to the unit of the classification, moreover, each line (pattern edge) is classified into a plurality of ranks and is thus extracted corresponding to the reference. In some cases, thus, small data are sufficient and an operation can easily be carried out. For example, in the case in which the classification is carried out depending on a distance from the closest pattern, a data processing can easily be performed by using an inspection for each unit.

Referring to the unit of the classification, furthermore, each area is classified into a plurality of ranks and is thus extracted corresponding to the reference. Consequently, slicing as a unit can be more simplified and the classification can efficiently be carried out. For example, in the case in which a plurality of patterns having the same node is extracted, the processing can easily be carried out by using a classifying method for each area.

Desirably, a decision can be made more properly if the accuracy condition is changed to make the decision depending on an increase or decrease in the pattern width of the mask pattern of the photomask. For example, in case of a line and space pattern, it is necessary to use accuracy conditions considering a distance from the closest pattern to be set within a predetermined range or more when an error is made in such a direction as to increase the pattern width of the mask pattern. On the other hand, when the error is made in such a direction as to decrease the pattern width, it is necessary to use the accuracy conditions considering the pattern width to be a predetermined width or more.

Whether the pattern is a dummy pattern is detected. If the accuracy conditions are relaxed when the pattern is the dummy pattern, it is possible to prevent a photomask to be originally acceptable from being rejected on unnecessary accuracy conditions.

Even if the drawing pattern is a dummy pattern, the accuracy condition alters depending on which pattern is an adjacent pattern. Accordingly, if the accuracy conditions are relaxed when the pattern adjacent to the dummy pattern is a dummy pattern, it is possible to prevent a photomask to be originally acceptable from being rejected on unnecessary accuracy conditions.

Moreover, whether a plurality of patterns has the same node is detected, and the accuracy conditions are relaxed when hey have the same node. For example, if two adjacent patterns have the same node, they may be close to each other. If a contact is made through a plurality of contact holes, moreover, it is preferable that any of contact hole patterns should function. In the case in which there is a plurality of patterns having the same node, thus, they may be conducted or any of them preferably functions in many cases and the accuracy conditions maybe relaxed in many cases.

In the case in which the same node is obtained by a pattern in the same layer, moreover, a decision can be made by only the drawing data. Consequently, an inspecting easiness is particularly high and this method is effective.

Also in the case in which a contact is made through a pattern in a layer positioned on the upper or lower layers so that the same node is obtained, furthermore, this method is effective.

Moreover, when the drawing pattern is a wiring pattern including a contact array, the deciding step serves to detect whether one contact array or more is/are taken and to change the accuracy condition depending on whether one contact array or more is/are taken. In the case in which a plurality of contact arrays is taken, there is no problem of a characteristic if any of them is formed normally. Consequently, the accuracy condition may be relaxed.

Furthermore, when the drawing pattern is a pattern for forming a contact hole, the deciding step serves to detect whether one contact array or more is/are taken and to change the accuracy condition depending on whether one contact array or more is/are taken. In the case in which a plurality of contact arrays is taken, similarly, there is no problem of a characteristic if any of them is formed normally. Consequently, the accuracy condition may be relaxed.

A high-speed wiring region may be a high accuracy region.

Moreover, accuracy maybe more decreased for an additional capacity region which is added in order to reduce a noise.

It is desirable that the extracting step should serve to classify the drawing pattern into two ranks and to extract the same depending on whether a critical point determined by an intersection of a relational expression of a manufacturing defect density and a manufacturing defect size and a relational expression of a pattern area weighed by a manufacturing defect generation probability and the manufacturing defect size is exceeded based on the critical point. Consequently, it is possible to optimize the trade-off between a yield and a mask inspecting cost.

It is desirable that an apparatus for inspecting a photomask for a semiconductor integrated circuit formed based on drawing pattern data should comprise means for classifying a drawing pattern of the semiconductor integrated circuit into a plurality of ranks in accordance with a predetermined reference and extracting a plurality of pattern data, means for determining inspecting accuracy which is required for each of the ranks and generating accuracy data, and means for deciding whether the pattern data satisfy the accuracy data for each of the classified pattern data.

Moreover, the invention provides inspecting data of a photomask for a semiconductor integrated circuit formed based on drawing pattern data, comprising a plurality of pattern data extracted by a classification of the drawing pattern of the semiconductor integrated circuit into a plurality of ranks in accordance with a predetermined reference, and accuracy data indicative of inspecting accuracy which is required for each of the ranks.

By using the data, it is possible to provide a photomask having a high reliability at a high speed with a low cost.

The invention provides a method of generating inspecting data, comprising the steps of classifying a drawing pattern of a semiconductor integrated circuit into a plurality of ranks in accordance with a predetermined reference and extracting a plurality of pattern data, and determining inspecting accuracy which is required for each of the ranks and generating accuracy data.

According to the method, it is possible to form inspecting data capable of providing a photomask having a high reliability at a high speed with a low cost.

Hereupon, a drawing pattern of the semiconductor integrated circuit indicates a pattern constituting a region excluding a scribe line in a semiconductor region on a wafer.

BRIEF DESCRIPTION OF THE DRAWINGS

In the accompanying drawings:

FIG. 6 is a view showing an inspecting method according to a second embodiment of the invention;

FIG. 7 is a view showing an inspecting method according to a third embodiment of the invention;

FIGS. 11A to 11D are views showing an inspecting method according to a sixth embodiment of the invention;

FIGS. 12A to 12D are views showing an inspecting method according to a seventh embodiment of the invention;

FIGS. 13A to 13D are views showing an inspecting method according to an eighth embodiment of the invention;

FIGS. 14A to 14D are views showing an inspecting method according to a ninth embodiment of the invention;

FIGS. 18A to 18C are views showing an inspecting method according to a twelfth embodiment of the invention;

DETAILED DESCRIPTION OF THE PREFERRED EMBODIMENTS

Next, description will be given to a photomask inspecting method according to an embodiment of the invention.

First Embodiment

In a photomask inspecting method according to the invention, when inspecting a photomask for a semiconductor integrated circuit formed based on drawing pattern data, a drawing pattern of the semiconductor integrated circuit is classified into a plurality of ranks in accordance with a predetermined reference and is thus extracted, inspecting accuracy is determined for each of the ranks, and quality of the photomask is decided depending on whether the determined inspecting accuracy is satisfied.

Figure 1:
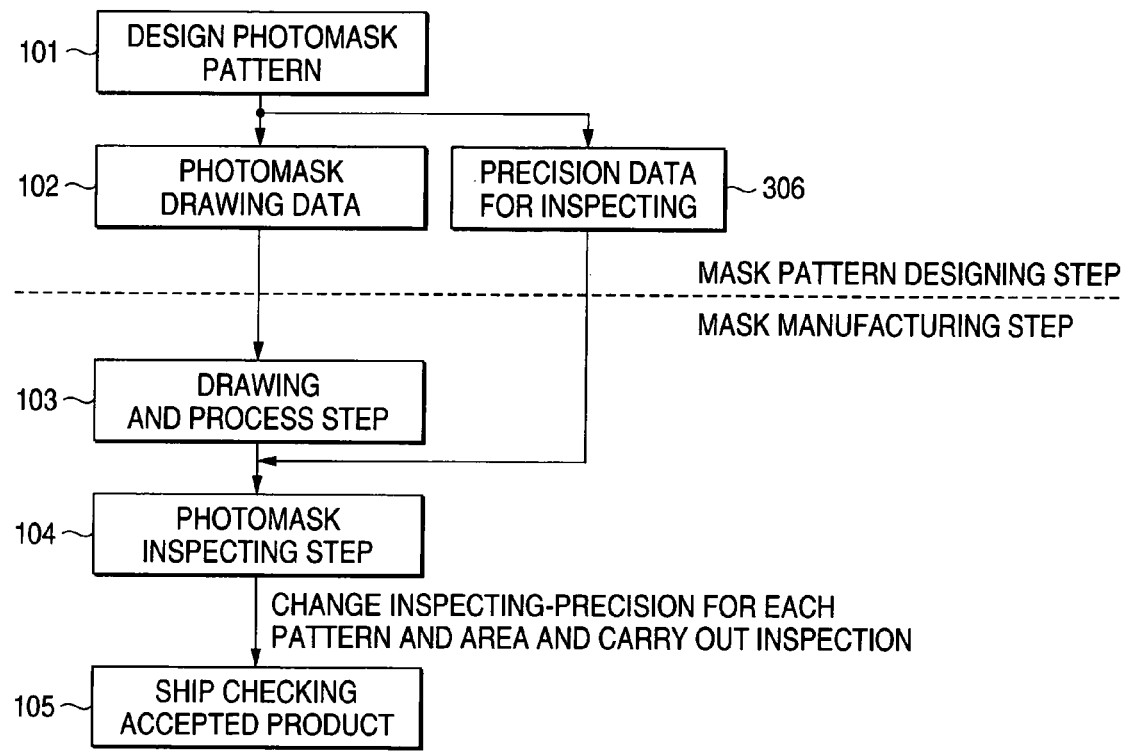
FIG. 1 is an inspecting flow chart showing a photomask inspecting method according to a first embodiment of the invention.

FIG. 1 shows a photomask inspecting flow according to the embodiment. While constant accuracy is specified from a design rule over a whole photomask in a conventional inspecting flow, inspecting accuracy data 306 are separately formed based on a photomask pattern obtained at a photomask pattern design step 101 and the inspection of the photomask is executed based on an inspecting accuracy reference set for each pattern area on the basis of the inspecting accuracy data 306.

More specifically, first of all, the inspecting accuracy data 306 are separately formed based on the photomask pattern obtained at the photomask pattern design step 101.

Figure 2:
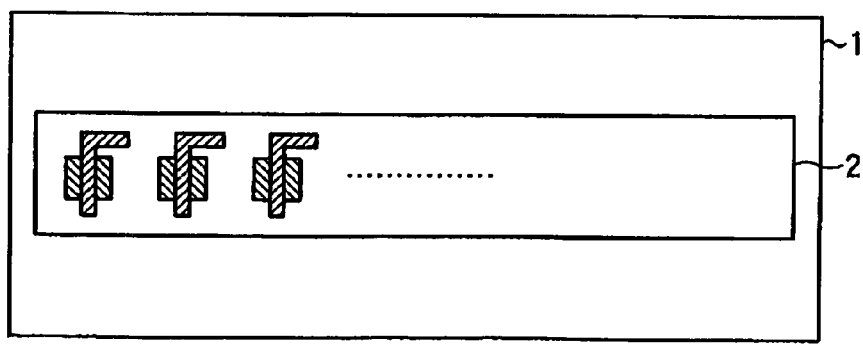
FIG. 2 is a view showing a semiconductor integrated circuit to be inspected according to the first embodiment of the invention.
Figure 3:
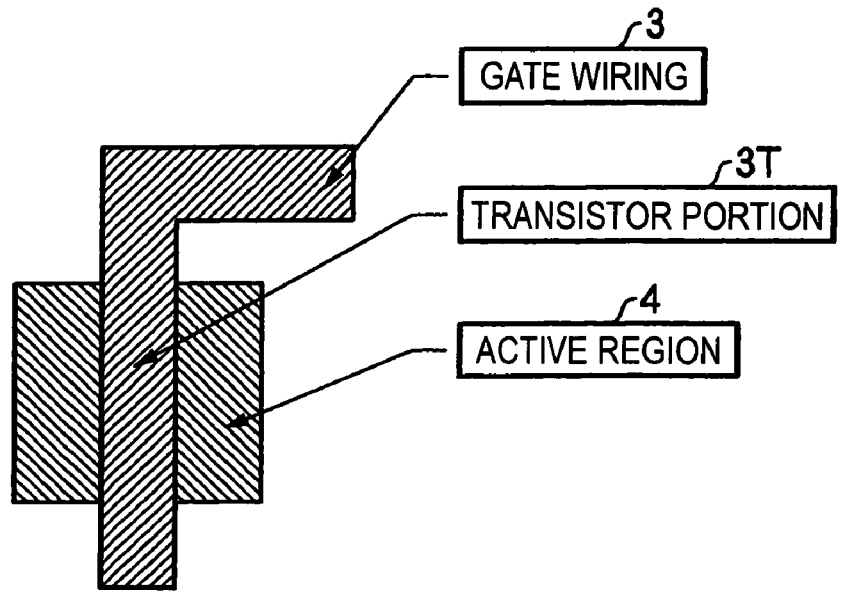
FIG. 3 is an explanatory view showing the transistor portion of the semiconductor integrated circuit.

For example, as shown in a typical view of an example in FIG. 2, only a transistor region 2 is extracted from a layout pattern 1 of a polycrystalline silicon layer including a gate wiring. The transistor region 2 thus extracted is constituted by forming source and drain regions in an active region 4 surrounded by an isolating region (not shown) as shown in an enlarged view showing a main part in FIG. 3. A portion in which the gate wiring 3 is provided over the active region 4 acts as a portion for determining a channel length.

Figure 4:
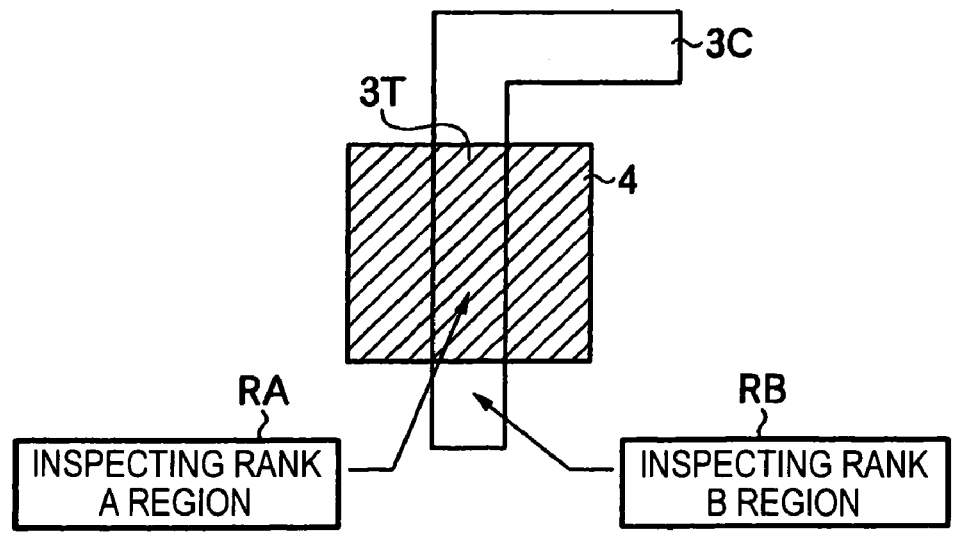
FIG. 4 is an explanatory view showing the inspecting method.

As shown in FIG. 4, accordingly, a gate wiring 3T provided on the active region 4 is a region for greatly depending on a transistor characteristic. Therefore, pattern accuracy is to be very high. On the other hand, a region 3C other than the gate wiring 3T provided on the active region 4 may be rougher than the gate wiring 3T provided on the active region 4.

In the pattern of the gate wiring 3, the gate wiring 3T provided on the active region 4 is set to be an A rank region RA and the gate wiring 3C, a gate other than the active region and whole other portions in the chip are set to be a B rank region RB, and these patterns are separately extracted. The pattern accuracy for the inspection is set to be higher in the A rank than that in the B rank and data are created in two stages.

Thus, photomask drawing data (layout pattern data) are created at a step 102 based on the layout pattern data obtained at the photomask pattern design step 101.

Based on the layout pattern data obtained at the step 101, then, the pattern region is divided into two ranks having the A rank and the B rank and inspecting accuracy data 306 in each division are created.

The inspecting accuracy data thus obtained are extracted together with the photomask drawing data obtained at the step 102 and are transferred to a photomask creating division or company.

In the photomask creating division or company receiving the photomask drawing data obtained at the step 102 and the inspecting accuracy data 306 obtained at the step 306, thereafter, a pattern is continuously formed on a photomask blank through a photomask drawing process (step 103).

Next, the defect of the photomask pattern thus formed is inspected with necessary accuracy for each region based on the inspecting accuracy data 306 (step 104).

Figure 5:
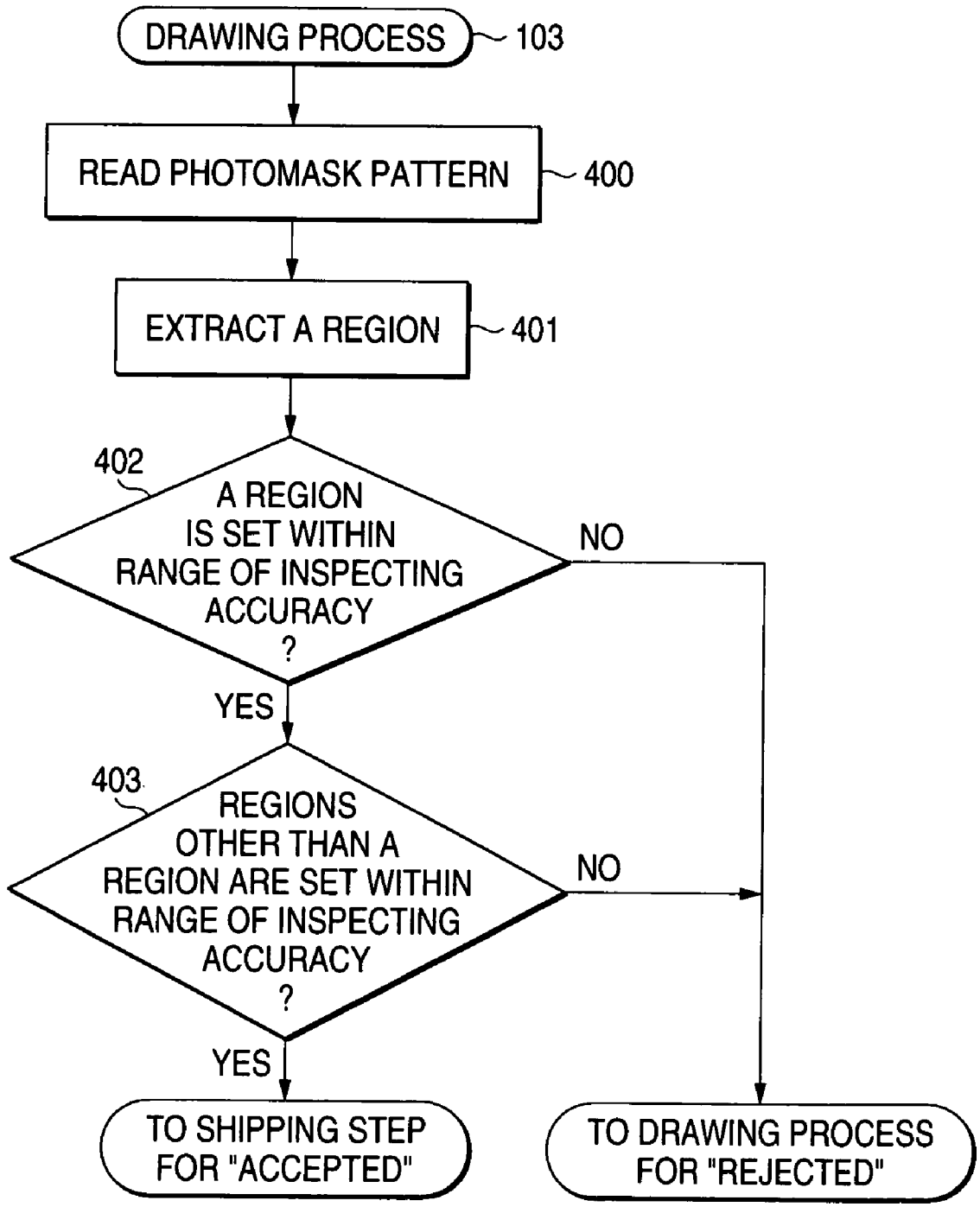
FIG. 5 is a flow chart showing an inspecting step in the inspecting flow according to the first embodiment of the invention.

At the inspecting step 104, as shown in FIG. 5, only a region corresponding to the inspecting region having the A rank (RA in FIG. 4) is extracted from the formed photomask pattern (step 401) and it is decided whether the inspecting region is set within the range of the inspecting accuracy (step 402).

If it is decided that the inspecting region is set within the range of the inspecting accuracy at the step 402, thereafter, it is decided whether the residual region, that is, the inspecting region having the B rank (a whole region other than RA in FIG. 4, that is, a region of a chip 1 in FIG. 2) is set within the range of the inspecting accuracy (step 403).

If it is decided that the inspecting region is set within the range of the inspecting accuracy at the step 403, it is set to be acceptable and the processing proceeds to a shipping step 105 in FIG. 1.

On the other hand, if it is decided that the range of the inspecting accuracy is exceeded at the step 403, the inspecting region is set to be rejected and the processing returns to the step 103 again in which the photomask is manufactured.

If it is decided that the range of the inspecting accuracy is exceeded at the step 402, moreover, the inspecting region is set to be rejected and the processing returns to the step 103 again in which the photomask is manufactured.

If the manufacture and the inspection are thus repeated and it is decided that there is no defect at the inspecting step 104, an inspection accepted product is shipped (step 105).

According to this method, importance is particularly attached to the maintenance of a channel length to be the functional feature of a gate wiring, and a region to influence the channel length is set to be the region having the rank A and is caused to have higher pattern accuracy. In this method, accordingly, the inspection is carried out by using the inspecting accuracy data with high accuracy for only the region having the rank A requiring the high pattern accuracy, while an accuracy reference is more relaxed to carry out the inspection in the region having the rank B requiring no high pattern accuracy. Therefore, the inspection is not unnecessarily strict and the inspection is carried out in a short time, and furthermore, an inspecting defect is detected in an early stage. Correspondingly, a cost can be reduced.

Thus, the inspection can be carried out with optimum inspecting accuracy in a short time and a photomask of high quality can be formed at a low cast. Moreover, a TAT can be shortened.

At the deciding step, there is often employed a method of carrying out an observation based on the accuracy conditions while observing a pattern on the photomask by using a microscope. It is also possible to pick up an image by a CCD camera and to carry out an image processing using an image pick-up pattern as image data, thereby extracting a pattern and referring to accuracy data every extracted pattern to make a decision. For the decision itself, moreover, a comparative decision processing maybe carried out by the image processing, thereby implementing an automatic processing.

Second Embodiment

While the classification of the inspecting rank is specified for each region in the first embodiment, it may be specified for each pattern.

More specifically, as shown in FIG. 6, only the gate pattern of a region constituting a true gate region in the gate wiring 3 is set to be an An inspecting rank pattern PA corresponding to an inspecting rank with high accuracy, and the other patterns are set to be a B inspecting rank pattern PB corresponding to a lower rank.

Also in this case, at a photomask inspecting step, the embodiment is the same as the first embodiment except that a method of extracting inspecting data and an inspecting reference are different.

By this method, similarly, a channel length can reliably be maintained and a photomask of high quality can be implemented in a short time at a low cost in the same manner as in the first embodiment. By this method, particularly, it is possible to produce an advantage that data indicative of an inspecting rank can be formed on drawing data (mask pattern data) as compared with the first embodiment.

Third Embodiment

While the classification of the inspecting rank is specified for each region in the first embodiment, moreover, it may be specified by the edge of a pattern.

More specifically, as shown in FIG. 7, only the gate pattern edge of a region constituting a true gate region in a gate wiring 3 is set to be an An inspecting rank edge EA corresponding to an inspecting rank with high accuracy, and the other patterns are set to be a B inspecting rank edge EB corresponding to a lower rank.

Also in this case, the embodiment is the same as the first embodiment except that a method of extracting inspecting data and an inspecting reference are different at a photomask inspecting step.

According to this method, it is possible to obtain an advantage that a deciding rank can be set every edge as compared with the first embodiment.

Fourth Embodiment

Next, description will be given to a fourth embodiment of the invention.

While the inspecting method aiming at the maintenance of the channel length of a gate wiring in a transistor has been described in the first to third embodiments, description will be given to an inspecting method which particularly pays attention to the detection of a shift in the contact of a gate wiring pattern having a hole such as a contact hole and the prevention of a contact error in this example.

Attention is paid to the presence of a contact hole h for a contact with the gate wiring of a transistor and an inspecting rank is classified.

Figure 8A:
FIGS. 8A to 8D are views showing an inspecting method according to a fourth embodiment of the invention.

More specifically, in the transistor array chip shown in FIG. 2, a region having the contact hole h over a gate wiring pattern 3 is particularly inspected in an inspecting rank with high accuracy as shown in FIG. 8A.

Figure 8B:
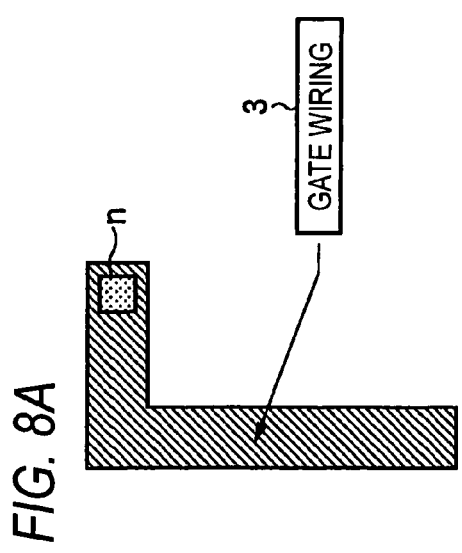

As shown in FIG. 8B, specification is carried out by a region, and a square region having a predetermined size which has a contact hole as a center is set to be an An inspecting rank region RA having a high accuracy rank and the other regions are set to be a B inspecting rank region RB, which are used as inspecting data.

At an inspecting step, the inspection is executed in accordance with the same flow chart as that shown in FIG. 5.

According to such a structure, the inspection is carried out with higher accuracy in the vicinity of the contact hole. Consequently, a contact error can be reduced and a photomask having a high reliability can be formed at a high speed.

Figure 8C:
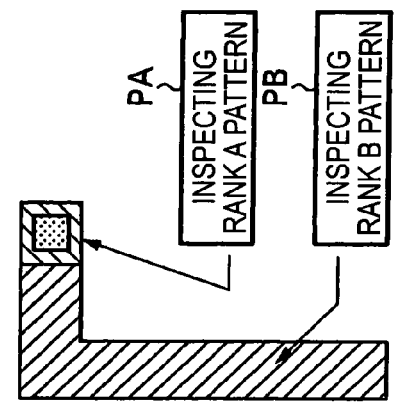

As a variant of the fourth embodiment, moreover, specification is carried out by a pattern, and only a gate pattern provided in the vicinity of the contact hole h in the gate wiring 3 is set to be an An inspecting rank pattern PA corresponding to an inspecting rank with high accuracy and the other patterns are set to be a B inspecting rank pattern PB corresponding to a lower rank as shown in FIG. 8C.

Also in this case, the same photomask inspecting step as that in the embodiments is executed except that a method of extracting inspecting data and an inspecting reference are different.

According to this method, it is possible to produce an advantage that a mask inspecting cost can be more reduced while suppressing a damage on a yield as compared with the first embodiment.

Figure 8D:
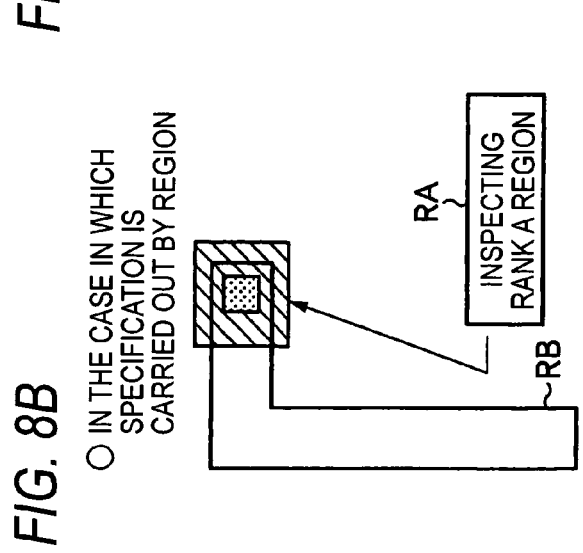

As a variant of the fourth embodiment, moreover, specification is carried out by an edge, and only a gate pattern edge provided in the vicinity of the contact hole h in the gate wiring 3 is set to be an An inspecting rank edge EA corresponding to an inspecting rank with high accuracy and the other patterns are set to be a B inspecting rank edge EB corresponding to a lower rank as shown in FIG. 8D.

Also in this case, the same photomask inspecting step as that in the embodiments is executed except that a method of extracting inspecting data and an inspecting reference are different.

According to this method, it is possible to produce an advantage that a deciding rank can be set for each edge as compared with the first embodiment.

While the photomask for the gate wiring of a semiconductor integrated circuit constituting a transistor array has been described in the embodiment, it is apparent that the photomask can also be applied to other semiconductor integrated circuits.

Fifth Embodiment

Next, description will be given to a fifth embodiment of the invention.

In the first to third embodiments, there has been described the inspecting method which particularly attaches importance to the maintenance of the channel length to be the functional feature of the gate wiring of the transistor. In the fourth embodiment, there has been described the inspecting method which particularly attaches importance to the maintenance of the contact to be the functional feature of the gate wiring of the transistor. Both of these are functional features and description will be given to an inspecting method which particularly pays attention to the feature of a shape.

Description will be given by taking, as an example, the photomask for a gate wiring to form the transistor array chip shown in FIG. 2.

Figure 9A:
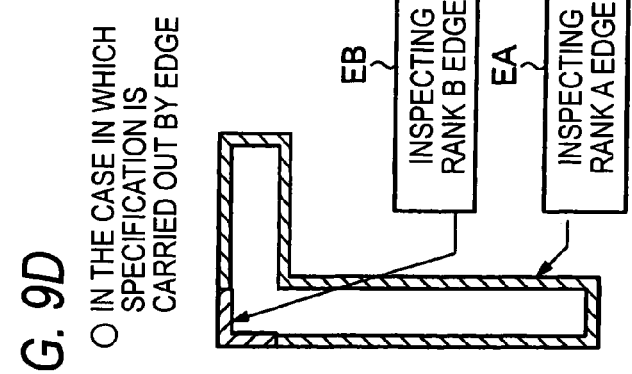
FIGS. 9A to 9D are views showing an inspecting method according to a fifth embodiment of the invention.

In this example, a corner portion C of a pattern is slightly smooth except for a signal transmitting section of a high frequency circuit and does not influence a characteristic in many cases. Taking note of this respect, in the transistor array chip shown in FIG. 2, a region provided in the vicinity of the corner portion C is inspected in an inspecting rank with particularly low accuracy over a gate wiring pattern 3 as shown in FIG. 9A.

Figure 9C:
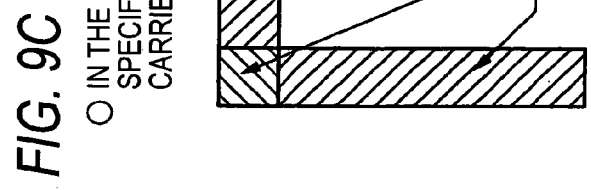
Figure 9B:
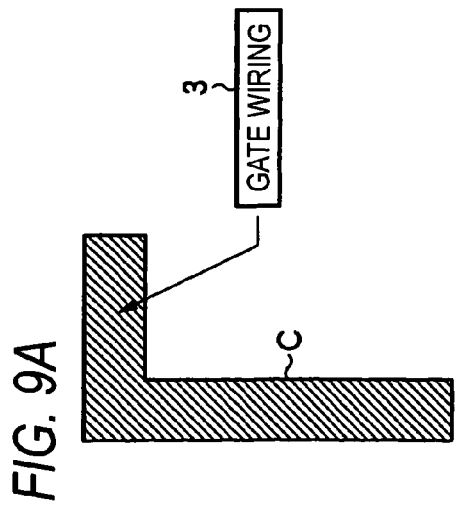

As shown in FIG. 9B, specification is carried out by a region determined through the wavelength of a light source for exposure and a pattern interval, and a square region is set to be a B inspecting rank region RB having a lower accuracy rank and the other regions are set to be an An inspecting rank region RA, which are used as inspecting data.

Referring to an inspecting step, an inspection is executed in accordance with the same flow chart as that shown in FIG. 5.

First of all, the square region provided in the vicinity of the corner portion is set to be the B inspecting rank region RB having a lower accuracy rank and the other regions are set to be the An inspecting rank region RA as described above, and the defect of a photomask pattern which is formed is inspected with necessary accuracy for each region based on inspecting accuracy data created with a classification into ranks in two stages (step 104).

Figure 10:
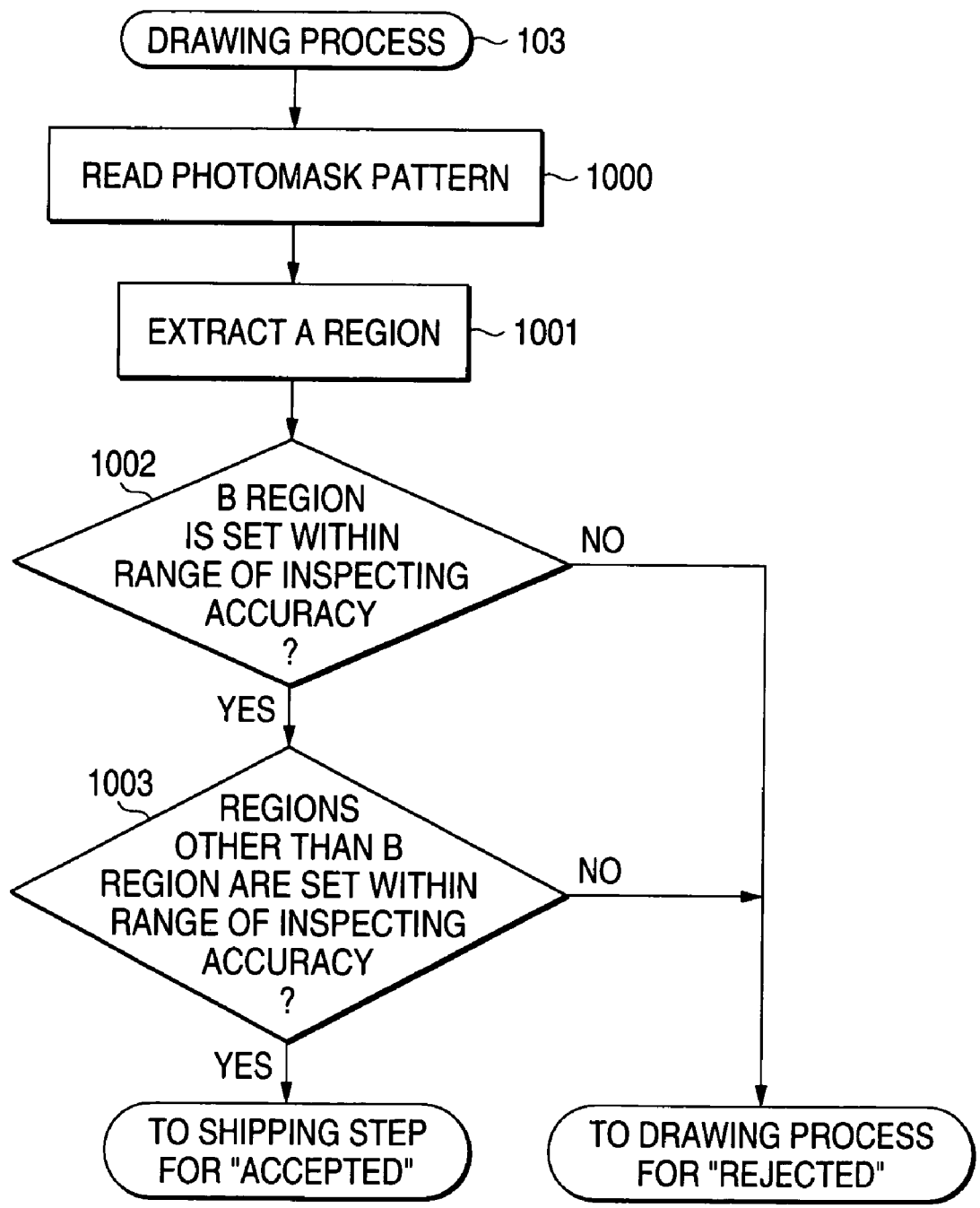
FIG. 10 is a flow chart showing the inspecting method according to the fifth embodiment of the invention.

At the inspecting step 104, as shown in FIG. 10, only a region corresponding to an inspecting region having a B rank (see FIG. 9B) is extracted from the formed photomask pattern (step 1001), and it is decided whether the inspecting region is set within the range of the inspecting accuracy (step 1002).

If it is decided that the inspecting region is set within the range of the inspecting accuracy at the step 1002, it is decided whether a residual region, that is, the inspecting region having the A rank (all regions other than B in FIG. 9B) is set within the range of the inspecting accuracy (step 1003).

If it is decided that the inspecting region is set within the range of the inspecting accuracy at the step 1003, a product is accepted and the processing proceeds to the shipping step 105 in FIG. 1.

On the other hand, if it is decided that the inspecting region exceeds the range of the inspecting accuracy at the step 1003, the product is rejected and the processing returns to the step 103 again in which the photomask is manufactured.

If it is decided that the inspecting region exceeds the range of the inspecting accuracy at the step 1002, moreover, the product is rejected and the processing returns to the step 103 again in which the photomask is manufactured.

Thus, the manufacture and the inspection are repeated and a product decided to have no defect at the inspecting step 104 is shipped as an inspecting accepted product (step 105).

According to such a structure, attention is paid to the shape of a pattern and a region corresponding to the corner portion of the pattern is inspected with accuracy reduced. Therefore, a variation which does not make troubles of functions is set to be acceptable. Thus, a product which is originally decided to be rejected by the inspection is accepted. Thus, a yield can be enhanced and a photomask having a high reliability can be formed at a high speed.

As a variant of the fifth embodiment, moreover, specification is carried out by a pattern, and only a pattern in the corner of the gate wiring 3 is set to be a B inspecting rank pattern PB corresponding to an inspecting rank with low accuracy and the other patterns are set to be an An inspecting rank pattern PA corresponding to a higher rank as shown in FIG. 9C. Herein, the rank is determined based on a distance from the corner.

Also in this case, the same photomask inspecting step as that in the embodiments is executed except that a method of extracting inspecting data and an inspecting reference are different.

By this method, similarly, it is possible to produce an advantage that data indicative of the inspecting rank can be particularly formed on drawing data (mask pattern data) as compared with the first embodiment.

Figure 9D:
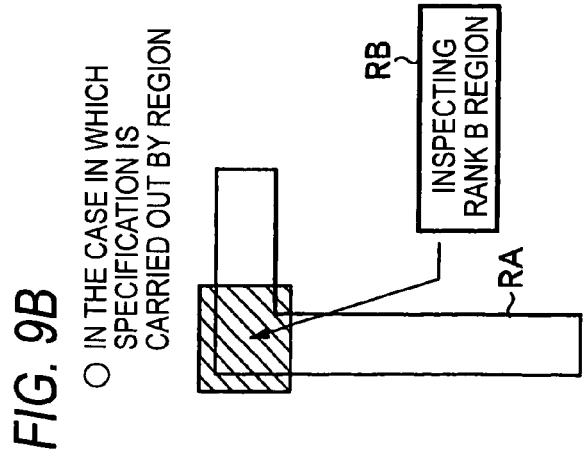

As a variant of the fifth embodiment, moreover, specification is carried out by an edge, and only a pattern edge in the corner portion of the gate wiring 3 is set to be a B inspecting rank edge EB corresponding to an inspecting rank with low accuracy and the other patterns are set to be an An inspecting rank edge EA corresponding to a higher rank as shown in FIG. 9D.

Also in this case, the same photomask inspecting step as that in the embodiments is executed except that a method of extracting inspecting data and an inspecting reference are different.

According to this method, it is possible to produce an advantage that a deciding rank can be set for each edge as compared with the first embodiment.

While the photomask for the gate wiring of a semiconductor integrated circuit constituting a transistor array has been described in the embodiment, it is apparent that the photomask can also be applied to other semiconductor integrated circuits.

Sixth Embodiment

Next, a sixth embodiment of the invention will be described.

In the invention, description will be given to an inspecting method in which a classification is carried out based on the feature of a shape, particularly, the interval of a wiring, thereby dividing an accuracy rank successively to the fifth embodiment.

Description will be given by taking, as an example, the photomask for a gate wiring to form the transistor array chip shown in FIG. 2.

In this example, the photomask is applied to the case in which the formation is carried out through a process for generating a defect in such a direction that the pattern is thickened, and the inspecting standards of a region having a small line width in a region in which a wiring is particularly formed on the pattern at a high density are set to be high and the inspecting standards of the other regions are set to be low. In the transistor array chip shown in FIG. 2, lines 11a, 11b and 11c are arranged in a line and space region as shown in FIG. 11A. Taking note of intervals w1 and w2 between these lines, a region in which the interval w1 has a certain value or less is set to be a higher inspecting region, and the other regions are particularly inspected in an inspecting rank having accuracy reduced.

As shown in FIG. 11B, specification is carried out by a region, and a region having a small line interval w1 is set to be an An inspecting rank region RA having a higher accuracy rank and the other regions are set to be a B inspecting rank region RB, which are used as inspecting data.

At an inspecting step, the inspection is executed in accordance with the same flow chart as that shown in FIG. 5.

Thus, the manufacture and the inspection are repeated and a product decided to have no defect at the inspecting step 104 is shipped as an inspecting accepted product (step 105).

According to such a structure, attention is paid to the shape of a pattern and a region having a small line interval is inspected with an increase in accuracy. Therefore, the inspection is carried out with high accuracy for only a region requiring a high accuracy pattern. Consequently, a product which is originally decided to be rejected by the inspection is accepted. Thus, a yield can be enhanced and a photomask having a high reliability can be formed at a high speed.

As a variant of the sixth embodiment, moreover, specification is carried out by a pattern, and only a pattern having a small line interval in a gate wiring 3 is set to be an An inspecting rank pattern PA corresponding to an inspecting rank with high accuracy and the other patterns are set to be a B inspecting rank pattern PB corresponding to a lower rank as shown in FIG. 11C.

Also in this case, the same photomask inspecting step as that in the embodiments is executed except that a method of extracting inspecting data and an inspecting reference are different.

According to this method, similarly, it is possible to produce an advantage that data indicative of the inspecting rank can be particularly formed on drawing data (mask pattern data) as compared with the first embodiment.

As a variant of the sixth embodiment, moreover, specification is carried out by an edge, and only a pattern edge of a pattern having a small wiring interval in the gate wiring 3 is set to be an An inspecting rank edge EA corresponding to an inspecting rank with high accuracy and the other patterns are set to be a B inspecting rank edge EB corresponding to a lower rank as shown in FIG. 11D.

Also in this case, the same photomask inspecting step as that in the embodiments is executed except that a method of extracting inspecting data and an inspecting reference are different.

According to this method, it is possible to produce an advantage that a deciding rank can be set for each edge as compared with the first embodiment.

While the photomask for the gate wiring of a semiconductor integrated circuit constituting a transistor array has been described in the embodiment, it is apparent that the photomask can also be applied to other semiconductor integrated circuits.

Seventh Embodiment

Next, a seventh embodiment of the invention will be described.

In the embodiment, description will be given to an inspecting method in which a classification is carried out based on the feature of a shape, particularly, a wiring width, thereby dividing an accuracy rank successively to the sixth embodiment.

Description will be given by taking, as an example, the photomask for a gate wiring to form the transistor array chip shown in FIG. 2.

In this example, the photomask is applied to the case in which the formation is carried out through a process for generating a defect in such a direction that the pattern is thinned, and the inspecting standards of a region having a small line width in a region in which a wiring is particularly formed on the pattern at a high density are set to be high and the inspecting standards of the other regions are set to be low, which are used as inspecting data. In the transistor array chip shown in FIG. 2, lines 12a and 12b are arranged in a line and space region as shown in FIG. 12A. Taking note of line widths L1 and L2, a region in which the line width L1 has a predetermined value or less is set to be a higher inspecting region, and the other regions are particularly inspected in an inspecting rank having accuracy reduced.

As shown in FIG. 12B, specification is carried out by a region, and a region having a small line width L1 is set to be an An inspecting rank region RA having a higher accuracy rank and the other regions are set to be a B inspecting rank region RB.

At an inspecting step, the inspection is executed in accordance with the same flow chart as that shown in FIG. 5.

Thus, the manufacture and the inspection are repeated and a product decided to have no defect at the inspecting step 104 is shipped as an inspecting accepted product (step 105).

According to such a structure, attention is paid to the shape of a pattern and a region having a small line width is inspected with an increase in accuracy. Therefore, the inspection is carried out with high accuracy for only a region requiring a high accuracy pattern. Consequently, a product which is originally decided to be rejected by the inspection is accepted. Thus, a yield can be enhanced and a photomask having a high reliability can be formed at a high speed.

As a variant of the seventh embodiment, moreover, specification is carried out by a pattern, and only a pattern having a small line width in a gate wiring 3 is set to be an An inspecting rank pattern PA corresponding to an inspecting rank with high accuracy and the other patterns are set to be a B inspecting rank region PB corresponding to a lower rank as shown in FIG. 12C.

Also in this case, the same photomask inspecting step as that in the embodiments is executed except that a method of extracting inspecting data and an inspecting reference are different.

According to this method, similarly, it is possible to produce an advantage that data indicative of the inspecting rank can be particularly formed on drawing data (mask pattern data) as compared with the first embodiment.

As a variant of the sixth embodiment, moreover, specification is carried out by an edge, and only a pattern edge of a pattern having a small wiring width in the gate wiring 3 is set to be an An inspecting rank edge EA corresponding to an inspecting rank with high accuracy and the other patterns are set to be a B inspecting rank edge EB corresponding to a lower rank as shown in FIG. 12D.

Also in this case, the same photomask inspecting step as that in the embodiments is executed except that a method of extracting inspecting data and an inspecting reference are different.

According to this method, as compared with the embodiments, it is possible to produce an advantage that a yield can be maintained stably without depending on the direction of a defect (an increase and decrease in the pattern width) as compared with the embodiments.

While the photomask for the gate wiring of a semiconductor integrated circuit constituting a transistor array has been described in the embodiment, it is apparent that the photomask can also be applied to other semiconductor integrated circuits.

Eighth Embodiment

Next, an eighth embodiment of the invention will be described.

In the embodiment, description will be given to a method of inspecting a photomask for forming a contact hole and inspecting data. Description will be given to an inspecting method of carrying out a classification and dividing an accuracy rank to relax inspecting standards in the case in which a functional feature, that is, a plurality of contact holes having the same node is present successively to the first embodiment.

Description will be given by taking, as an example, a photomask for forming a contact hole which serves to form the transistor array chip shown in FIG. 2.

This example is applied to the case in which a defect is generated in such a direction that a pattern is thinned, that is, the case in which an etching section is tapered by isotropic etching. Therefore, inspecting standards in a region on a pattern where a plurality of contact holes having the same node is present are set to be lower than those in the other regions. In the transistor array chip shown in FIG. 2, when contact hole patterns 13a and 13b shown in FIG. 13A are arranged, attention is paid to these forming situations and the region where a plurality of contact holes having the same node is present is particularly inspected in an inspecting rank with lower accuracy than that in the other regions.

As shown in FIG. 13B, specification is carried out by a region, and a region in which a plurality of contact holes having the same node is present is set to be a B inspecting rank region RB having a lower accuracy rank and the other regions are set to be an An inspecting rank region RA, which are used as inspecting data.

At an inspecting step, the inspection is executed in accordance with the same flow chart as that shown in FIG. 10.

Thus, the manufacture and the inspection are repeated and a product decided to have no defect at the inspecting step 104 is shipped as an inspecting accepted product (step 105).

According to such a structure, attention is paid to the shape situation of a pattern and a region in which a plurality of contact holes having the same node is present is inspected in a lower accuracy rank. Therefore, a product which is originally decided to be rejected by the inspection is accepted. Thus, a yield can be enhanced and a photomask having a high reliability can be formed at a high speed.

As a variant of the eighth embodiment, moreover, specification is carried out by a pattern, and only a pattern 13b in which a plurality of contact holes having the same node is present is set to be a B inspecting rank pattern PB corresponding to an inspecting rank with low accuracy and the other regions are set to be an An inspecting rank pattern PA corresponding to a higher rank as shown in FIG. 13C.

Also in this case, the same photomask inspecting step as that in the embodiments is executed except that a method of extracting inspecting data and an inspecting reference are different.

According to this method, it is possible to produce an advantage that data indicative of the inspecting rank can be formed on drawing data (mask pattern data).

As a variant of the eighth embodiment, moreover, specification is carried out by an edge, and a pattern edge of a contact hole edge where a plurality of contact holes having the same node is present is set to be a B inspecting rank edge EB corresponding to an inspecting rank with lower accuracy and the other regions are set to be an An inspecting rank edge EA corresponding to a higher rank as shown in FIG. 13D.

Also in this case, the same photomask inspecting step as that in the embodiments is executed except that a method of extracting inspecting data and an inspecting reference are different.

According to this method, it is possible to produce an advantage that a deciding rank can be set for each edge as compared with the first embodiment.

While the photomask for the gate wiring of a semiconductor integrated circuit constituting a transistor array has been described in the embodiment, it is apparent that the photomask can also be applied to other semiconductor integrated circuits.

Moreover, the case in which a plurality of contact holes having the same node is present in a close region has been described in the embodiment. From a viewpoint in which it is sufficient that a contact can be made through any contact hole, it is preferable that the same inspecting method should be used also when the contact holes having the same node are present in separated positions.

While the description will be given to the inspection to be carried out in such a direction that the pattern is thinned in the process, that is, the size of the contact hole is decreased in the embodiments, moreover, the same inspection is carried out for etching in such a direction that overetching is generated to thicken the pattern, that is, the size of an opening region is increased.

Ninth Embodiment

Next, a ninth embodiment of the invention will be described.

In the eighth embodiment, the description has been given to the method of inspecting a photomask for forming a contact hole and the inspecting data. In this example, description will be given to an inspecting method of carrying out a classification to divide an accuracy rank in order to relax inspecting standards when a defect is generated in such a direction that a pattern is thickened in case of a functional feature, particularly, a pattern having the same node successively to the eighth embodiment in a photomask for forming a wiring pattern such as a gate wiring.

Description will be given by taking, as an example, the photomask for forming a contact hole which serves to form the transistor array chip shown in FIG. 2.

This example is applied to the case in which a defect is generated in such a direction that a pattern is thickened, and inspecting standards in a region including the patterns having different nodes in a region are set to be higher than the inspecting standards of the other regions. In the transistor array chip shown in FIG. 2, when lines 14a and 14b shown in FIG. 14A are arranged, attention is paid to these functional situations and a region including the patterns having different nodes is inspected in an inspecting rank with particularly higher accuracy than that in the other regions.

As shown in FIG. 14B, specification is carried out by a region, and a region in which a plurality of patterns having different nodes is present is set to be an An inspecting rank region RA and the region having the same node is set to be a B inspecting rank region RB. The accuracy is reduced to more decrease the inspecting rank of accuracy in the B inspecting rank region than that in the An inspecting rank region RA and this is used as inspecting data.

At an inspecting step, the inspection is executed in accordance with the same flow chart as that shown in FIG. 10.

Thus, the manufacture and the inspection are repeated and a product decided to have no defect at the inspecting step 104 is shipped as an inspecting accepted product (step 105).

According to such a structure, attention is paid to the shape situation of a pattern, and only a region in which the patterns having the different nodes is inspected in a higher accuracy rank and a region in which a plurality of pattern shaving the same node is present is inspected in a lower accuracy rank. Therefore, a product which is originally decided to be rejected by the inspection is accepted. Thus, a yield can be enhanced and a photomask having a high reliability can be formed at a high speed.

As a variant of the ninth embodiment, moreover, specification is carried out by a pattern, and only the pattern 14b in which a plurality of patterns having different nodes is present is set to be an An inspecting rank pattern PA corresponding to an inspecting rank with high accuracy and the other regions are set to be a B inspecting rank pattern PB corresponding to a lower rank as shown in FIG. 14C.

Also in this case, the same photomask inspecting step as that in the embodiments is executed except that a method of extracting inspecting data and an inspecting reference are different.

According to this method, it is possible to produce an advantage that data indicative of the inspecting rank can be formed on drawing data (mask pattern data).

As a variant of the ninth embodiment, moreover, specification is carried out by an edge, and an adjacent pattern edge of the pattern edge having the same node is set to be a B inspecting rank edge EB corresponding to an inspecting rank with lower accuracy and the other patterns are set to be an An inspecting rank edge EA corresponding to a higher rank as shown in FIG. 14D.

Also in this case, the same photomask inspecting step as that in the embodiments is executed except that a method of extracting inspecting data and an inspecting reference are different.

According to this method, it is possible to produce an advantage that a deciding rank can be set for each edge as compared with the first embodiment.

While the photomask for the gate wiring of a semiconductor integrated circuit constituting a transistor array has been described in the embodiment, it is apparent that the photomask can also be applied to other semiconductor integrated circuits.

In the embodiments, furthermore, it is decided whether the same node is used depending on whether the patterns in the same layer are connected to each other. By carrying out a connection through a contact hole over the upper or lower layer, it is also possible to carry out a classification based on the same node also in the case in which the same node is to be constituted.

Tenth Embodiment

Next, a tenth embodiment of the invention will be described.

Figure 15:
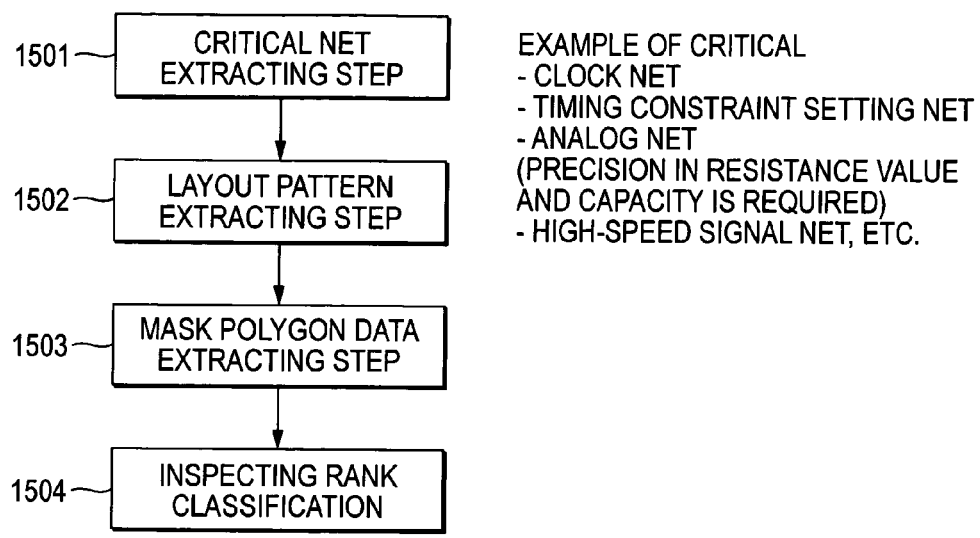
FIG. 15 is a diagram showing an inspecting method according to a tenth embodiment of the invention.

While the inspecting data are formed based on the layout pattern of a semiconductor integrated circuit in the embodiments, information taking note of a circuit function may be extracted from a net list to classify an inspecting rank. FIG. 15 is a flow chart.

More specifically, a critical net is extracted from a net list (step 1501).

The critical net includes a clock net, a timing constraint setting net, an analog net and a high-speed signal net.

A layout pattern is extracted from the critical net (step 1502).

Pattern data for a photomask are extracted from the layout pattern (step 1503).

Then, an inspecting rank is classified corresponding to each function (step 1504).

Thus, information is extracted from the net list based on a classification reference to which attention is paid. Consequently, it is possible to extract inspecting data at a higher speed.

Eleventh Embodiment

Next, an eleventh embodiment of the invention will be described.

While the description has been given to the inspecting method of forming inspecting data and using the same in the embodiments, a method of determining the threshold of inspecting accuracy will be described in the embodiment.

The embodiment is characterized in that the threshold of the inspecting accuracy is determined based on a critical point determined by an intersection of a relational expression of the sum of pattern areas weighed at the manufacturing defect generation probability of a photomask for a semiconductor integrated circuit and a manufacturing defect size and a relational expression of a manufacturing defect density and the manufacturing defect size.

Figure 16:
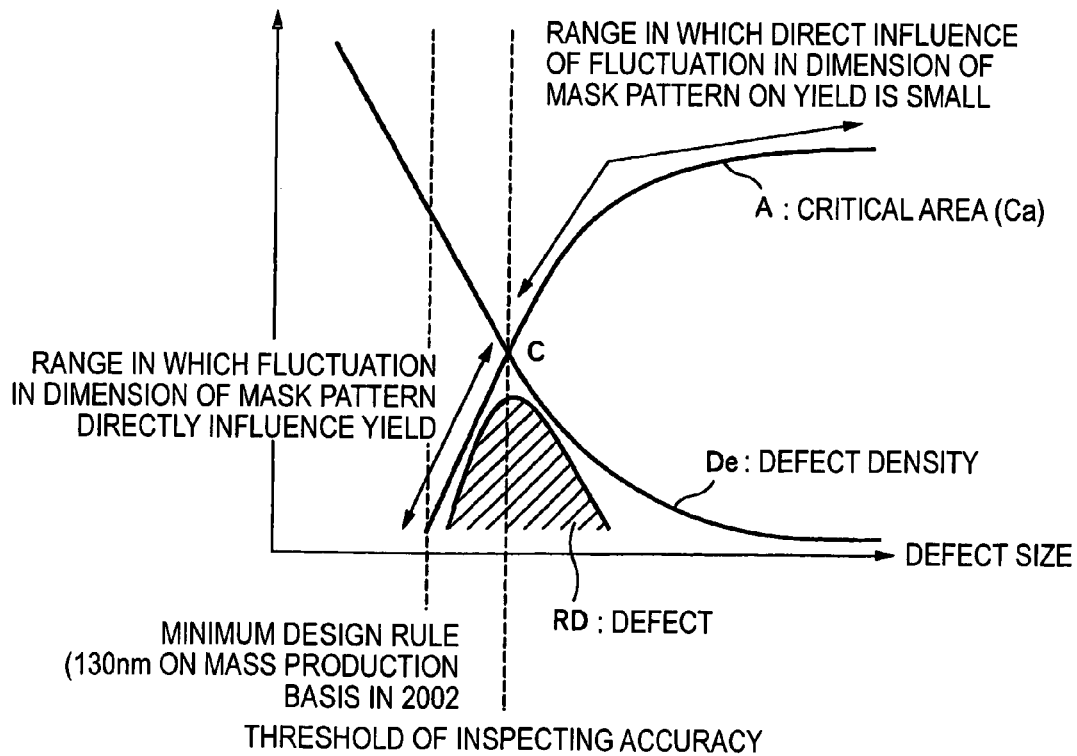
FIG. 16 is a chart showing an inspecting method according to an eleventh embodiment of the invention.

In this example, as shown in FIG. 16, there is obtained an intersection C of a relational curve A of the sum of the pattern areas weighed at the manufacturing defect generation probability of the photomask and the manufacturing defect size and a relational curve De (x) of the manufacturing defect density and the manufacturing defect size. An inspection with higher accuracy is used for a smaller pattern than C.

The reason is as follows. A yield is calculated from an area RD to be a product of the relational curve A and the relational curve De (x). In a smaller region than the intersection C, a fluctuation in a pattern dimension directly influences the yield.

Herein, an axis of ordinate indicates the sum of the pattern areas weighed at the manufacturing defect generation probability and the manufacturing defect density, and an axis of abscissa indicates the manufacturing defect size.

Figure 17A:
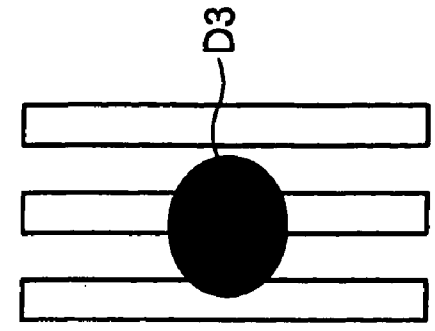
FIGS. 17A to 17C are views showing the inspecting method according to the eleventh embodiment of the invention.
Figure 17B:
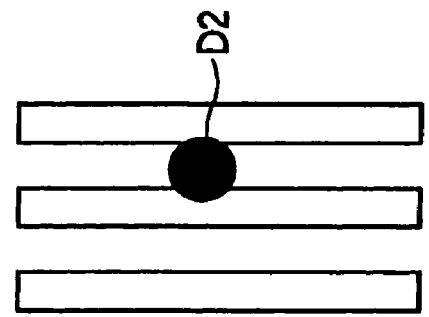
Figure 17C:
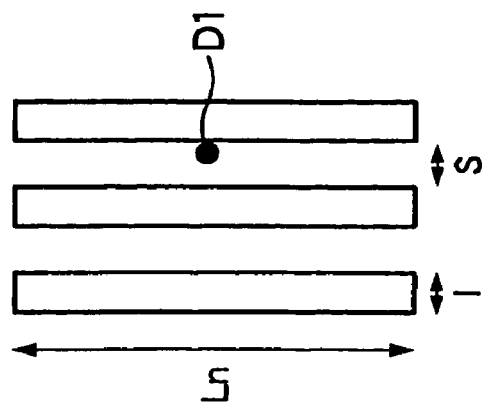

The threshold of the weighing of the manufacturing defect generation probability to be used in the relational curve A is determined based on a method shown in FIGS. 17A to 17C.

This method investigates the case in which defects D1 to D3 are formed on a pattern on the assumption of a line and space Ln having a line width of 1 and an interval of S.

As shown in FIG. 17A, when a size x of the defect D1 is smaller than the interval S, there is no short-circuit defect.

As shown in FIG. 17B, moreover, when the size x of the defect D1 is greater than the interval S and is smaller than 2l+S, there is a short-circuit defect according to circumstances.

As shown in FIG. 17C, furthermore, when the size x of the defect D1 is greater than 2l+S, there is the short-circuit defect.

In the case in which an open defect is generated, moreover, the open defect and an interval between a line and a space are reversed to each other.

Twelfth Embodiment

Next, a twelfth embodiment of the invention will be described.

In the embodiment, a structure is formed in order to optimize an area ratio in a manufacturing process and to reduce a noise through an additional capacity in a semiconductor integrated circuit chip. With this structure, a bypass capacitor having an MOS structure using a diffusion region of the same conductivity type as that of a substrate (P well) is automatically provided as a bypass capacitor under a power wiring region extended to an empty region, and a substrate contact provided under a ground wiring and the bypass capacitor provided under the power wiring are coupled to each other through a diffusion. Description will be given to a method of inspecting a photomask for forming the structure.

More specifically, FIGS. 18A to 18C (FIGS. 18B and 18C are A—A and B—B sectional views of FIG. 18A, respectively) are views showing a semiconductor integrated circuit formed by using a photomask obtained by the inspecting method according to the embodiment. FIG. 18A is a plan view in which the substrate contact is provided under the ground wiring and a bypass capacitor having an MOS structure using a diffusion region of the same conductivity type as that of a substrate is automatically provided as a bypass capacitor under a power wiring, and the substrate contact provided under the ground wiring and the bypass capacitor provided under the power wiring are coupled to each other through a diffusion.

According to the embodiment, the bypass capacitor is automatically provided under the power wiring extended to the empty region so that the area ratio in the manufacturing process can be optimized, and furthermore, the pattern of a ground wiring 1805 and a substrate contact formation diffusion region 1816 do not need to have high accuracy in the region extended to the empty region when the area of the chip is increased. Moreover, the substrate contact formation diffusion region 1816 formed under the groundwiring 1805 is extended and connected to a bypass capacitor formation diffusion region 1815 provided under a power wiring 1801. Consequently, the power wiring and the bypass capacitor, and the ground wiring 1805 and the bypass capacitor are connected to each other through a lower resistance than that of the substrate having a high resistance. Also in this functional sense and because of a large number of contacts 1807 provided in the same node, high accuracy is not required.

Accordingly, a pattern region for forming an additional capacity which is provided in the empty region is a dummy pattern having the same node, and a pattern region having lower accuracy is set to be a B rank region RB and a pattern region for forming the other regions is set to be an A rank region RA requiring the conditions with higher accuracy. Consequently, it is possible to obtain a photomask having a high reliability at a high speed and a low cost.

FIGS. 18A to 18C are plan views showing a graphic pattern according to the embodiment of the invention, in which a substrate contact is provided under the ground wiring 1805 and a bypass capacitor having an MOS structure using a diffusion region of the same conductivity type as that of the substrate is automatically provided as a bypass capacitor under the power wiring 1801 extended to an additional formation region, and a substrate contact provided under the ground wiring and the bypass capacitor provided under the power wiring are coupled to each other through a diffusion. A diffusion region 1817 for forming the bypass capacitor and the diffusion region 1816 for the substrate contact have the same polarity and are formed integrally with each other.

Thirteenth Embodiment

Next, a thirteenth embodiment of the invention will be described.

Figure 19:
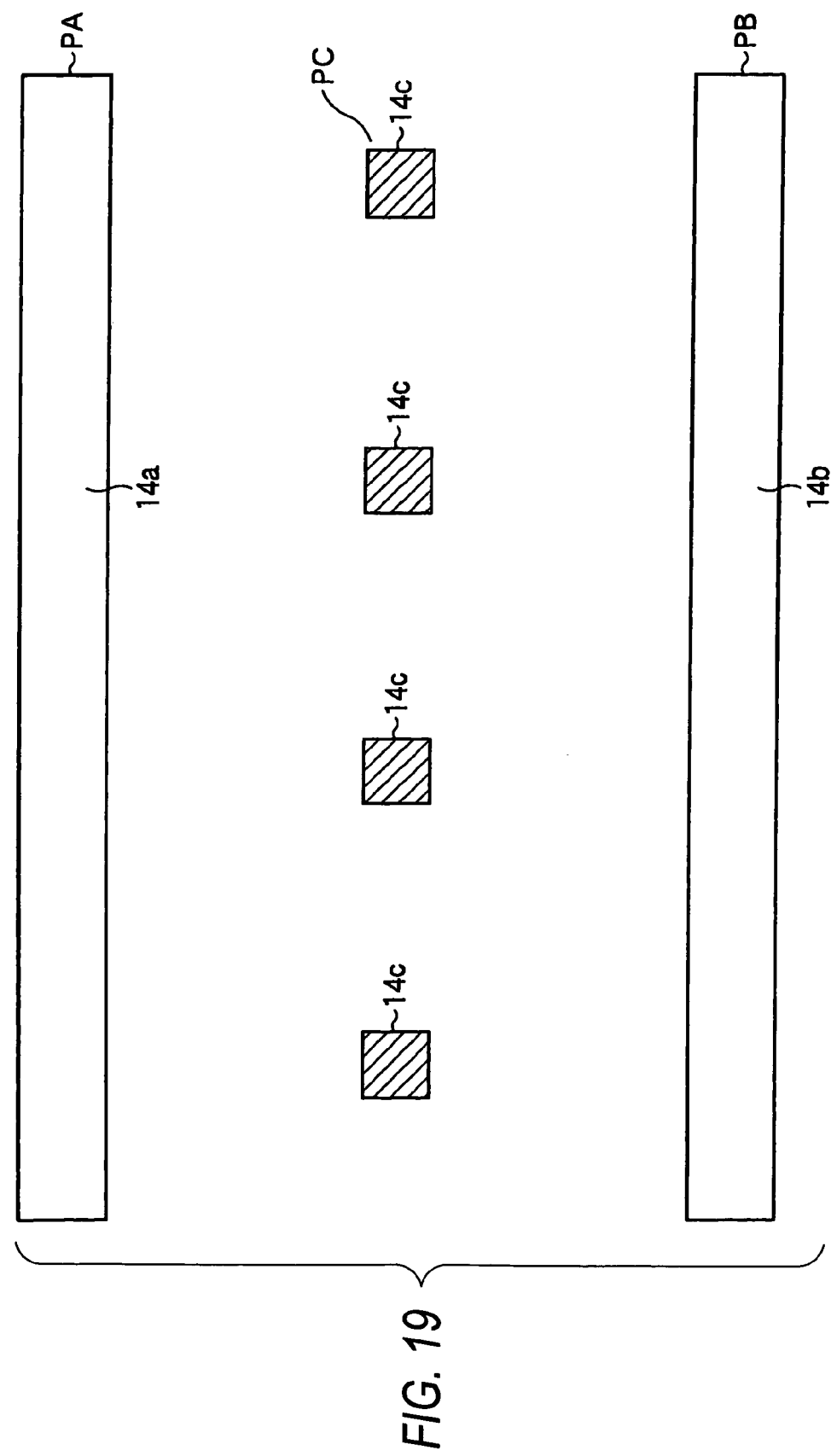
FIG. 19 is a view showing an inspecting method according to a thirteenth embodiment of the invention.

As shown in FIG. 14C in the ninth embodiment, furthermore, the description has been given to the classification of the line pattern 14b having the rank A and the line pattern 14a having the rank B in the line and space pattern. There will be considered an example of a classification in which a dummy pattern 14c is formed between the line pattern 14b having the rank A and the line pattern 14a having the rank B as shown in FIG. 19.

In the embodiment, a classification into pattern ranks PA and PB is carried out, and furthermore, the dummy pattern is set to be a pattern rank PC which may have lower accuracy and inspecting accuracy is reduced.

Consequently, a yield can be enhanced and a photomask having a high reliability can be formed at a higher speed.

Fourteenth Embodiment

Next, a fourteenth embodiment of the invention will be described.

Figure 20:
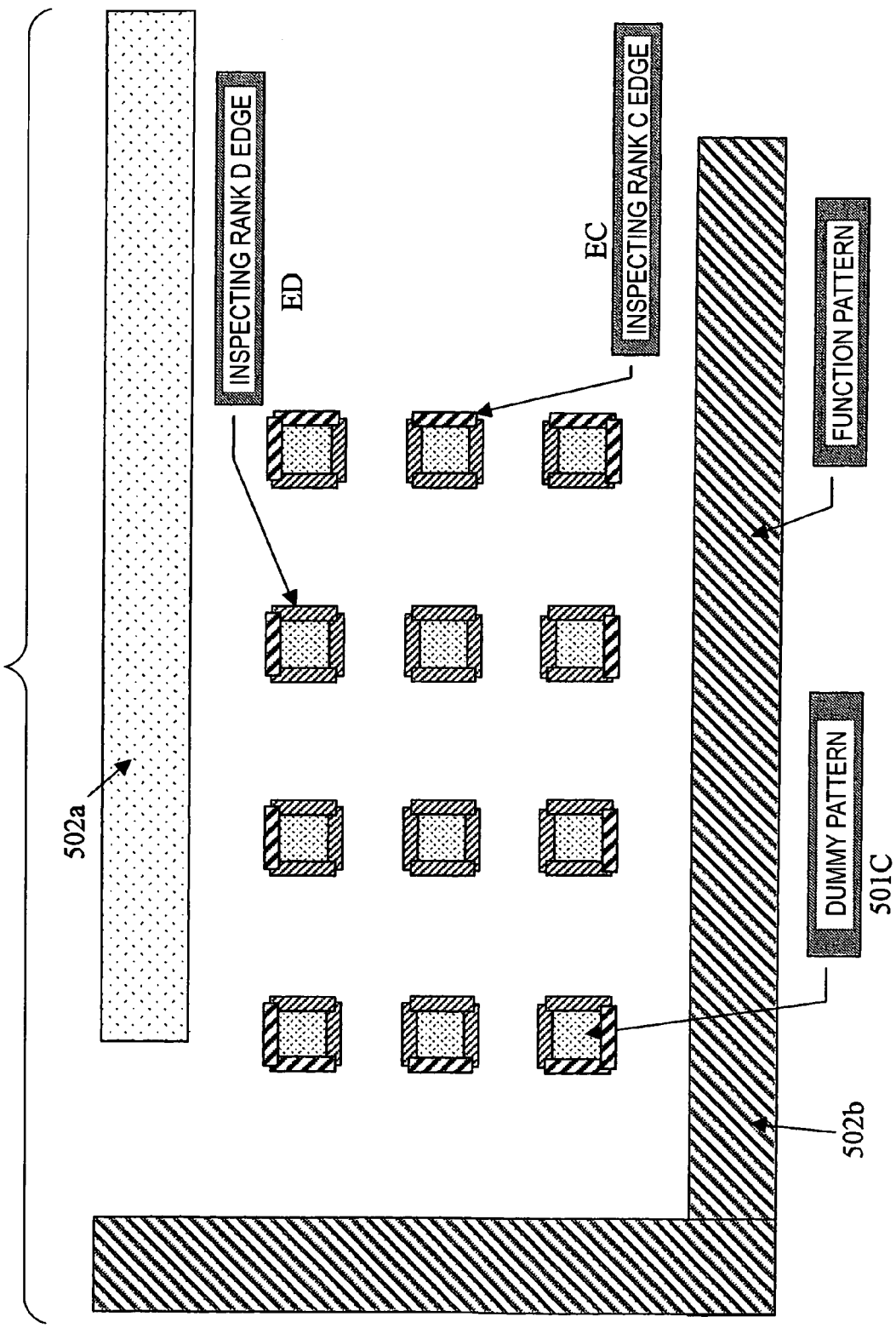
FIG. 20 is a view showing an inspecting method according to a fourteenth embodiment of the invention.

As shown in FIG. 14C in the ninth embodiment, furthermore, the description has been given to the classification of the line pattern 14b having the rank A and the line pattern 14a having the rank B in the line and space pattern. There will be considered an example of a classification in which a dummy pattern 501c is formed between the line pattern 502b having the rank A and the line pattern 502a having the rank B as shown in FIG. 20.

In the embodiment, a classification into pattern ranks PA and PB is carried out, and further, the dummy pattern is set to be a pattern rank PC which may have lower accuracy and furthermore, the dummy pattern is set to be a pattern rank PD which has the lowest accuracy, and inspecting accuracy is reduced.

More specifically, when the edges of the dummy patterns are adjacent, the pattern accuracy is not necessary. On the other hand, in the region where the dummy pattern is adjacent to the adjacent pattern, the pattern accuracy is made necessary. Accordingly, a classification of the dummy pattern is carried out such that the dummy pattern is set to be a rank C in the region adjacent to the line pattern 502b having the rank A and the dummy pattern is set to be a rank D in the region adjacent to the line pattern 502a having the rank B.

Consequently, a yield can be enhanced and a photomask having a high reliability can be formed at a higher speed.

If the classification is carried out in two stages, that is, the accuracy rank is once classified depending on whether a pattern has the same node, and furthermore, whether the pattern is dummy, thus, the processing can be carried out at a higher speed so that the yield can be enhanced.

Moreover, a classification in a plurality of stages is also effective, that is, the classification is carried out based on the feature of a shape and is further performed based on a functional feature.

Fifteenth Embodiment

Next, a fifteenth embodiment of the invention will be described.

While only the mask pattern to be resolved over the wafer has been described in the embodiments, it is necessary to change inspecting accuracy for the mask pattern which is not resolved over the wafer. In some cases, furthermore, it is necessary to consider the relationship between the function of the mask pattern itself and a peripheral pattern.

In the embodiment, description will be given to the inspection of a mask using a mask technique in which a density is substantially made uniform by the addition of very small graphics.

Figure 21:
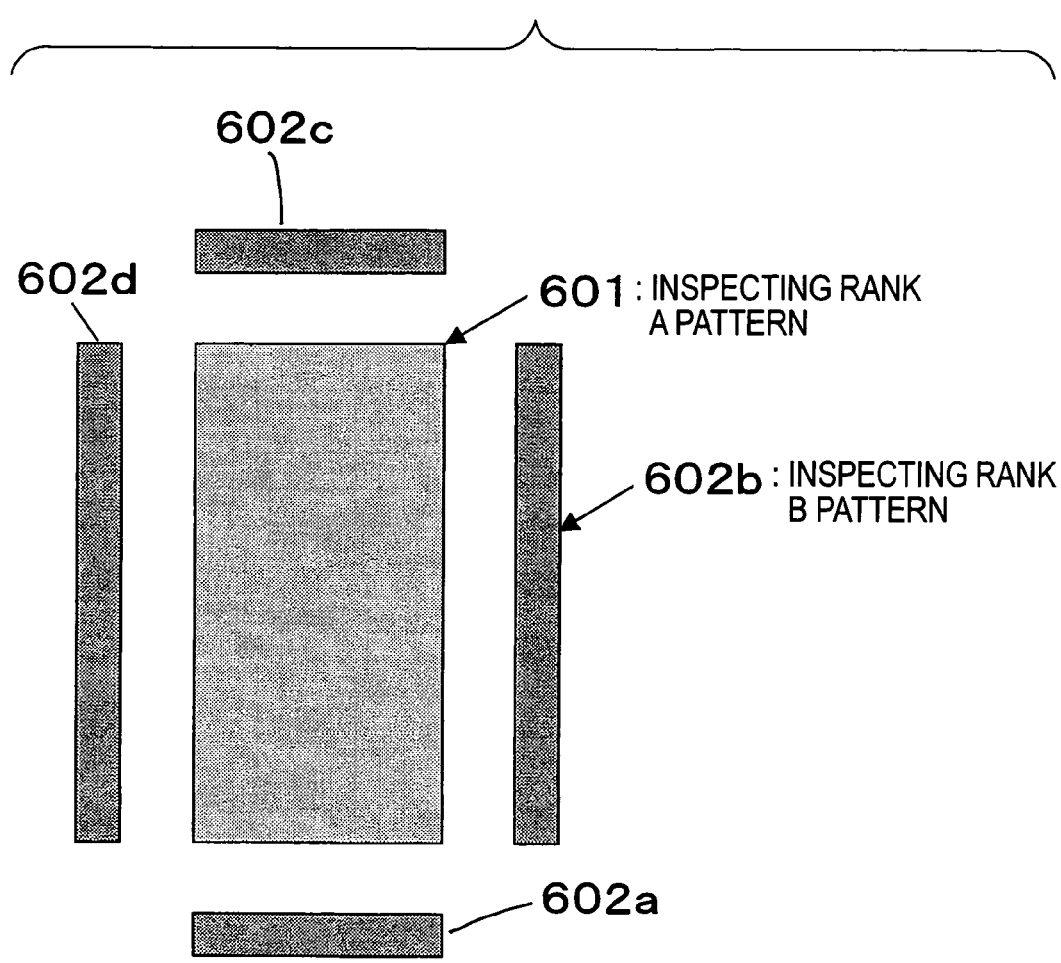
FIG. 21 is a view showing an inspecting method according to a fifteenth embodiment of the invention.

As shown in FIG. 21, a so-called assist bar (a scattering bar) uses a body pattern 601 to be body data, and four assist bars 602a to 602d separated from the body pattern 601 along the peripheral edge of the body pattern 601 by a predetermined interval a and designed to have such a width as not to be resolved over the wafer. With this structure, inspecting accuracy can be reduced. In this structure, the following three-respects are set to be conditions and pattern accuracy is decided for the assist bar. The following is taken into consideration. Only whether the following conditions are satisfied is set to be an inspecting condition, and a decision of "accepted" is given if the condition is satisfied:

1. Whether each of the assist bars 602a to 602d overlaps with the body pattern 601 through a defect in an enlarging direction (an increase in a pattern);
2. Whether the pattern of the assist bar is resolved over the wafer through the defect in the enlarging direction (the increase in the pattern); and
3. Whether the pattern of the assist bar over the mask disappears through the defect in a reducing direction (a decrease in the pattern).

In the embodiment, a classification into two portions is carried out, that is, the body data pattern is set to be a pattern rank PA and the assist bar is set to be a pattern rank PB, and furthermore, the result of the assist bar is decided according to the inspecting condition determined in accordance with the three specific inspecting conditions.

Thus, it is possible to form a photomask at a higher speed with a high yield.

Sixteenth Embodiment

Next, a sixteenth embodiment of the invention will be described.

Description will be given to the inspection of a mask comprising a phase shift pattern referred to as an enhancer mask for a contact. This technique serves to form a pattern having a high resolution through a main opening portion and a sub-opening portion provided on a periphery thereof in order to implement a very fine process. The main opening portion of the mask inverts the phase of a translucent substrate to be a mask base member by 180 degrees through digging to have the same phase as the phase of a shielding film formed in a halftone surrounding the main opening portion (a difference of 360 degrees).

Figure 22:
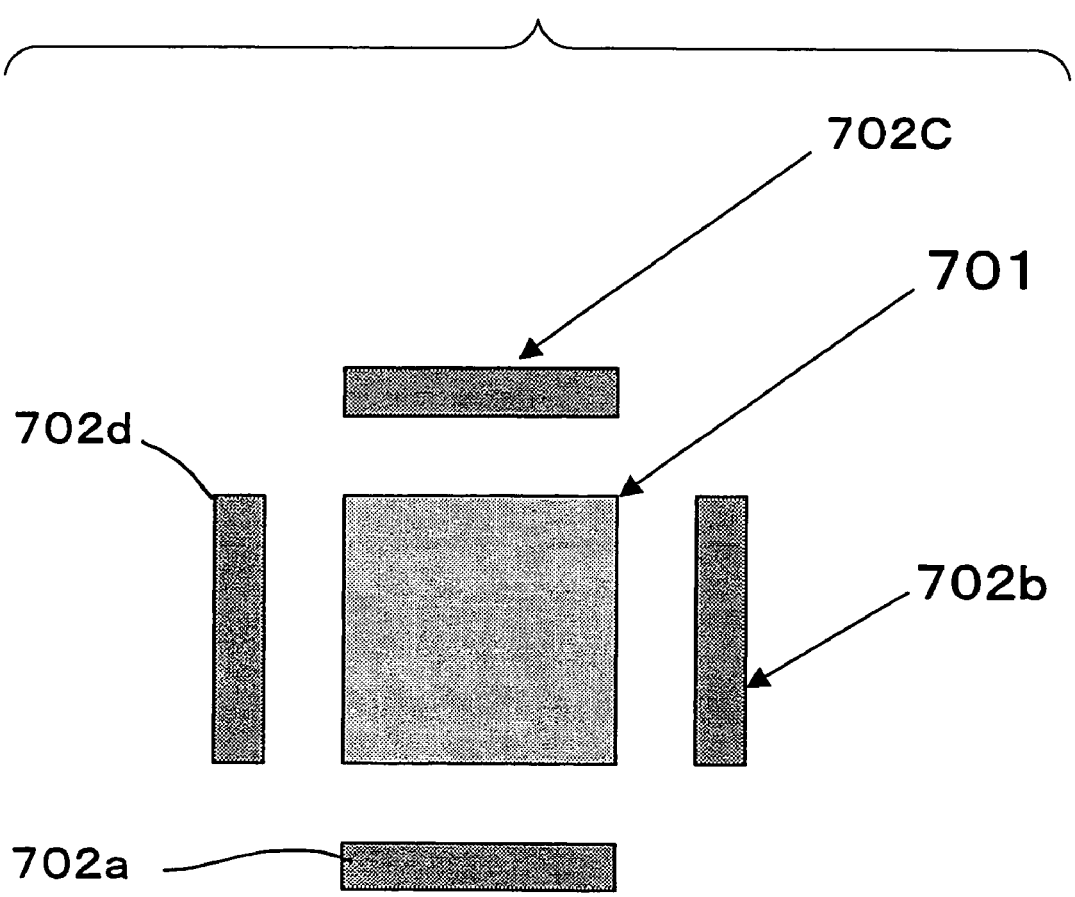
FIG. 22 is a view showing an inspecting method according to a sixteenth embodiment of the invention.

In the embodiment, as shown in FIG. 22, there are used a body pattern 701 constituting the main opening portion, and four sub-opening portions 702a to 702d separated from the body pattern 701 along the peripheral edge of the body pattern 701 by a predetermined interval d1 and designed to have such a width as not to resolve the opening portion itself over the wafer. With this structure, inspecting accuracy can be reduced. In this structure, the following two respects are set to be conditions and pattern accuracy is decided for the sub-opening portion. The following is taken into consideration. Only whether the following conditions are satisfied is set to be an inspecting condition, and a decision of "accepted" is given if the condition is satisfied:

1. Whether the sub-opening portion overlaps with each of the body patterns 702a to 702d through a defect in an enlarging direction (an increase in a pattern); and 2. Whether the pattern of the sub-opening portion disappears through the defect in a reducing direction (a decrease in the pattern).

In the embodiment, a classification into two portions is carried out, that is, the pattern of the body opening portion is set to be a pattern rank PA and the pattern of the sub-opening portion is set to be a pattern rank PB, and furthermore, the result of the sub-opening portion is decided according to the inspecting condition determined in accordance with the two specific inspecting conditions.

Thus, it is possible to form a photomask at a higher speed with a high yield.

Seventeenth Embodiment

Next, a seventeenth embodiment of the invention will be described below.

While the description has been given to the enhancer mask having the opening portion for a contact constituted by the main opening portion and the sub-opening portion in the embodiment, there will be described the inspection of a mask comprising a phase shift pattern referred to as an enhancer mask for a line. Referring to the mask, a phase shift of 180 degrees is arranged in a body pattern 801 comprising a shielding portion constituting a line pattern to form a thin line, and a portion other than the body pattern constitutes an opening of 0 degree.

Figure 23:
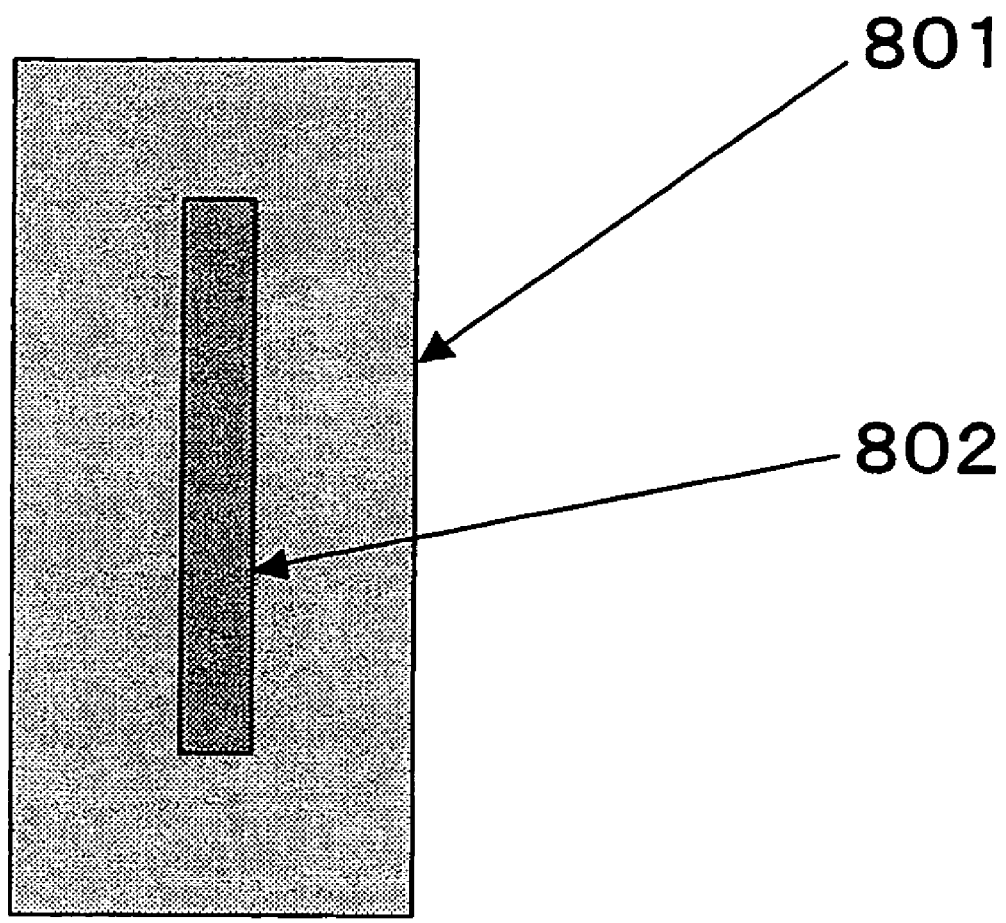
FIG. 23 is a view showing an inspecting method according to a seventeenth embodiment of the invention.

In the embodiment, as shown in FIG. 23, the body pattern 801 constituting the shielding portion constituted by a halftone pattern is formed and a phase shifter pattern 802 of 180 degrees is formed in the body pattern 801, and the phase shifter pattern itself is designed to have such a width as not to be resolved over the wafer. With this structure, inspecting accuracy for the phase shifter pattern can be reduced. In this structure, accordingly, the following two respects are set to be conditions and pattern accuracy is decided by setting inspecting accuracy for the phase shifter pattern to be a rank B and the other inspecting accuracy to be a rank A.

The phase shifter pattern is decided as to only whether the following conditions are satisfied. The following is taken into consideration. Only whether the following conditions are satisfied is set to be an inspecting condition, and a decision of "accepted" is given if the condition is satisfied:
1. Whether the phase shifter pattern 802 overlaps with the body pattern 801 through a defect in an enlarging direction (an increase in a pattern); and
2. Whether the pattern of the phase shifter disappears through the defect in a reducing direction (a decrease in the pattern).

In the embodiment, a classification into two portions is carried out, that is, the body pattern is set to be a pattern rank PA and the phase shifter is set to be a pattern rank PB, and furthermore, the result of the phase shifter is decided according to the inspecting condition determined in accordance with the two specific inspecting conditions.

Thus, it is possible to form a photomask at a higher speed with a high yield.

Eighteenth Embodiment

Next, an eighteenth embodiment of the invention will be described.

Description will be given to the inspection of a mask applied to a super-resolution technique using a chromless phase shift mask referred to as CPL (Chromless Phase Lithography) in a phase shift mask. This technique serves to carry out the formation of a pattern having a high resolution by four phase shifter patterns 902a to 902d comprising a thin pattern which cannot be resolved by itself in place of a body pattern 901 which is resolved to implement a very fine process. The phase shifter pattern of the mask is constituted by a halftone mask.

Figure 24:
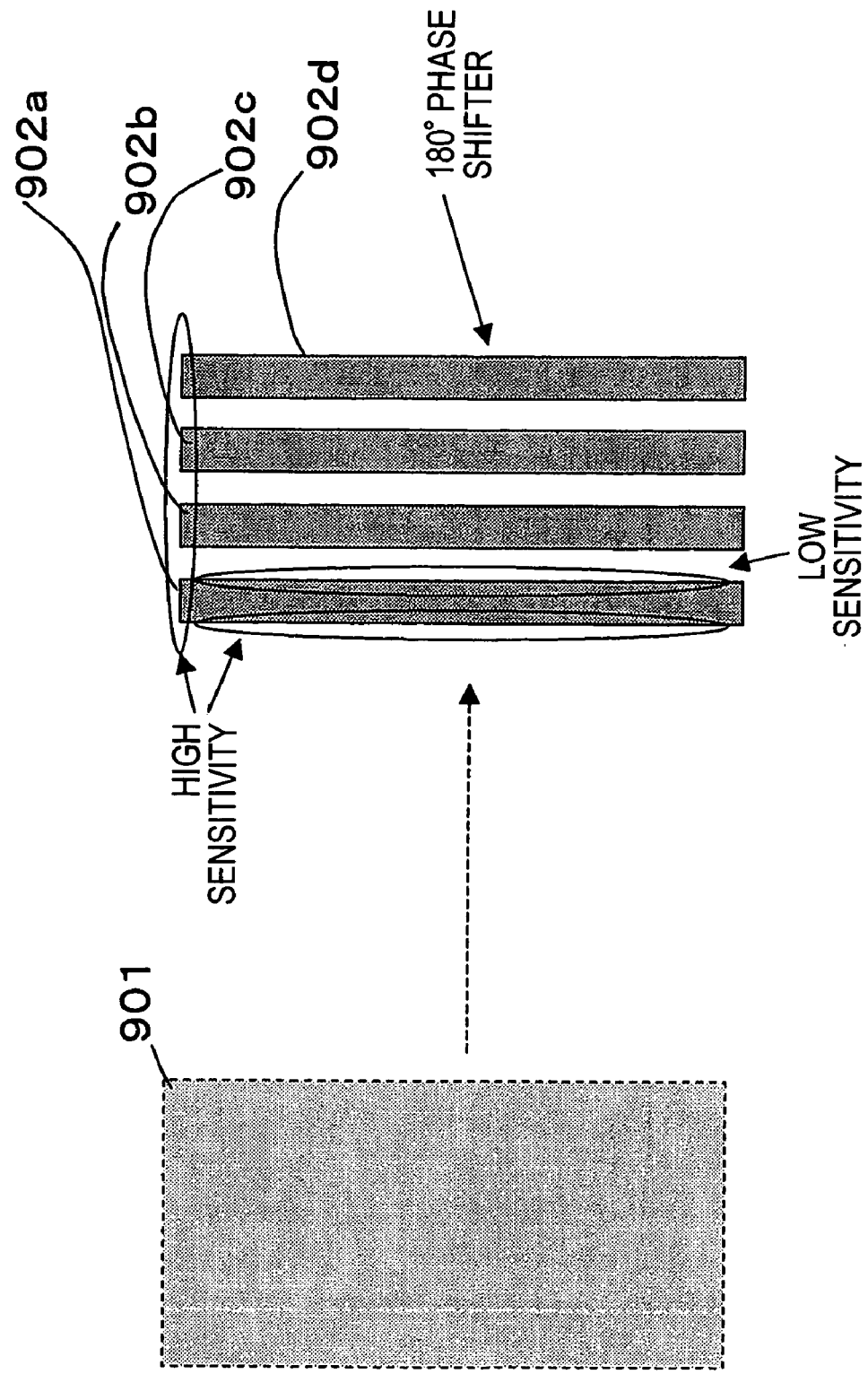
FIGS. 24A and 24B are views showing an inspecting method according to an eighteenth embodiment of the invention.
Figure 25:
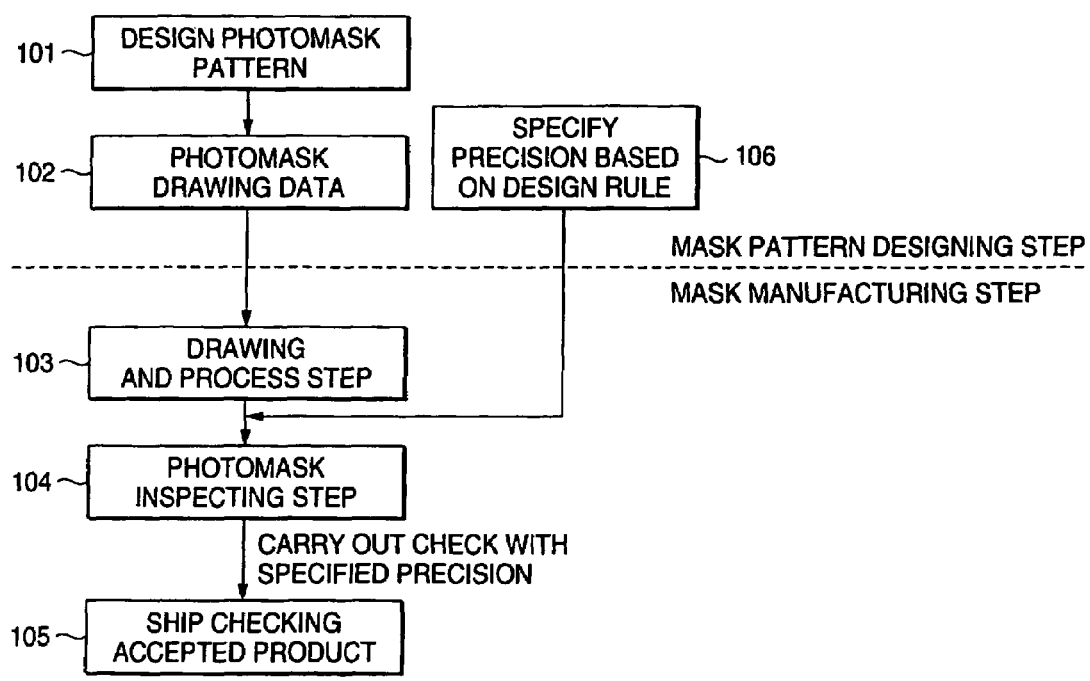
FIG. 25 is a flow chart showing an inspecting method according to a conventional example.
Figure 26B:
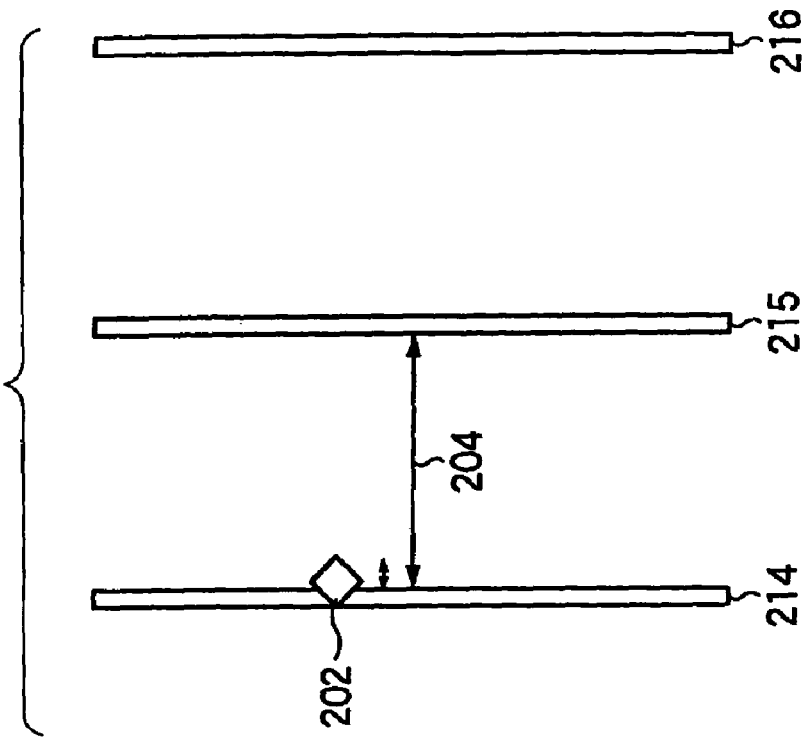
FIGS. 26A and 26B are views showing the inspecting method according to the conventional example.
Figure 26A:
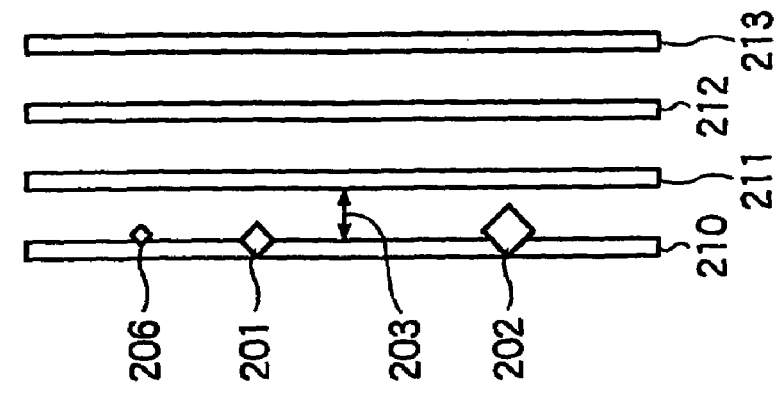

In the embodiment, as shown in FIG. 24B, there are used four phase shifter patterns 902a to 902d formed to have the same width in total as that of the body pattern 901 (FIG. 24A). With this structure, the inspecting accuracy of the phase shifter pattern can be more reduced than that of the body pattern. In this structure, the following three respects are set to be conditions and pattern accuracy is decided for the phase shifter pattern.

The following is taken into consideration. Only whether the following conditions are satisfied is set to be an inspecting condition, and a decision of "accepted" is given if the condition is satisfied:
1. Whether the phase shifters overlap with each other through a defect in an enlarging direction (an increase in a pattern);
2. Whether the phase shifter pattern disappears through the defect in a reducing direction (a decrease in the pattern); and
3. An inspecting sensitivity in a portion corresponding to the edge of the body pattern is not reduced.

In the embodiment, a classification into two portions is carried out, that is, the body pattern is set to be a pattern rank PA and the phase shifter pattern is set to be a pattern rank PB, and furthermore, the result of the phase shifter pattern is decided according to the inspecting condition determined in accordance with the three specific inspecting conditions.

In a phase shift mask using a so-called gate shrink technique in which a thin gate is formed with an interposition between shifters having different phases, moreover, a mask sensitivity is to be increased in only shifter edges opposed to each other and the inspecting accuracy may be decreased in other portions.

Thus, it is possible to form a photomask at a higher speed and with a high yield which is suitable for a feature reference.

If a classification in two stages is carried out, that is, the accuracy rank is once classified depending on whether the pattern has the same node, and is then classified depending on whether the pattern is dummy, consequently, the processing can be carried out at a higher speed and the yield can be enhanced.

As described above, according to the photomask inspecting method in accordance with the invention, all patterns and areas are inspected with allowable defect accuracy of a pattern interval which is conventionally the toughest. However, it is possible to implement the inspection with necessary accuracy for each region, each pattern or each edge. As a result, it is not necessary to correct a pattern which is rejected with unnecessary inspecting accuracy. Consequently, it is possible to reduce portions to be corrected. Thus, it is possible to reduce a time required for manufacturing the photomask and a manufacturing cost.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A method of inspecting a photomask for a semiconductor integrated circuit formed based on drawing pattern data, comprising the steps of:
classifying a drawing pattern of the semiconductor integrated circuit into a plurality of ranks in accordance with a reference depending on a feature of the drawing pattern and extracting the same;
determining inspecting accuracy for each of the ranks; and
deciding quality of the photomask depending on whether the determined inspecting accuracy is satisfied for each drawing pattern thus extracted,
wherein the deciding step serves to change an accuracy condition depending on an increase or decrease in a pattern width.

2. The method of inspecting a photomask according to claim 1, wherein the reference is a functional feature of the drawing pattern, and
the extracting step serves to classify the drawing pattern into a plurality of ranks and to extract the same depending on a circuit-functional feature of a pattern formed by the drawing pattern.

3. The method of inspecting a photomask according to claim 2, wherein the extracting step includes a step of classifying the drawing pattern of the semiconductor integrated circuit into a plurality of ranks and a step of extracting the same depending on whether the drawing pattern is a dummy pattern.

4. The method of inspecting a photomask according to claim 3, wherein the extracting step further includes a step of classifying the drawing pattern into a plurality of ranks depending on whether a pattern adjacent to the drawing pattern is a dummy pattern.

5. The method of inspecting a photomask according to claim 1, wherein the extracting step a step of classifying the drawing pattern of the semiconductor integrated circuit into a plurality of ranks and to extract the same depending on whether the drawing pattern has the same node.

6. The method of inspecting a photomask according to claim 1, wherein the reference is a feature of a shape of the drawing pattern, and
the extracting step includes a step of classifying the drawing pattern into a plurality of ranks and to extract the same depending on the feature of the shape of the drawing pattern.

7. The method of inspecting a photomask according to claim 6, wherein the extracting step serves to classify the drawing pattern into a plurality of ranks and to extract the same based on a distance from the closest pattern.

8. The method of inspecting a photomask according to claim 6, wherein the extracting step serves to classify the drawing pattern into a plurality of ranks and to extract the same based on a distance from a corner of the drawing pattern.

9. The method of inspecting a photomask according to claim 1, wherein the extracting step serves to classify the drawing pattern into the ranks and to extract the same depending on the reference for each pattern.

10. The method of inspecting a photomask according to claim 1, wherein the extracting step serves to classify the drawing pattern into the ranks and to extract the same depending on the reference for each pattern edge.

11. The method of inspecting a photomask according to claim 1, wherein the extracting step serves to classify the drawing pattern into the ranks and to extract the same depending on the reference for each area.

12. The method of inspecting a photomask according to claim 1, wherein the deciding step serves to detect whether the drawing pattern is a dummy pattern and to relax the accuracy condition when the drawing pattern is the dummy pattern.

13. The method of inspecting a photomask according to claim 12, wherein the deciding step serves to further relax the accuracy condition when a pattern adjacent to the drawing pattern is the dummy pattern.

14. The method of inspecting a photomask according to claim 1, wherein the deciding step serves to detect whether at least two patterns have the same node and to relax the accuracy condition when they have the same node.

15. The method of inspecting a photomask according to claim 1, wherein the deciding step serves to detect whether at least two patterns have the same node based on a pattern in the same layer and to relax the accuracy condition when they have the same node.

16. The method of inspecting a photomask according to claim 1, wherein the deciding step serves to detect whether at least two patterns have the same node by a contact through a pattern in a layer positioned on or under the layer, and to relax the accuracy condition when they have the same node.

17. The method of inspecting a photomask according to claim 1, wherein when the drawing pattern is a wiring pattern including a contact array,
the deciding step serves to detect whether one contact array or more is/are taken and to change the accuracy condition depending on whether one contact array or more is/are taken.

18. The method of inspecting a photomask according to claim 1, wherein when the drawing pattern is a pattern for forming a contact hole,
the deciding step serves to detect whether one contact array or more is/are taken and to change the accuracy condition depending on whether one contact array or more is/are taken.

19. The method of inspecting a photomask according to claim 1, wherein the feature is a relational expression of a manufacturing defect density and a manufacturing defect size, and
the extracting step includes a step of classifying the drawing pattern into two ranks and a step of extracting the same depending on whether a critical point determined by an intersection of the relational expression of the manufacturing defect density and the manufacturing defect size in a photomask and a relational expression of a pattern area weighed by a manufacturing defect generation probability on a pattern and the manufacturing defect size is exceeded based on the critical point.

* * * * *